(12) United States Patent
Tanaka et al.

(10) Patent No.: US 7,916,987 B2
(45) Date of Patent: Mar. 29, 2011

(54) BEAM HOMOGENIZER, LASER IRRADIATION APPARATUS, AND METHOD FOR MANUFACTURING SEMICONDUCTOR DEVICE

(75) Inventors: Koichiro Tanaka, Isehara (JP); Hirotada Oishi, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 222 days.

(21) Appl. No.: 12/149,969

(22) Filed: May 12, 2008

(65) Prior Publication Data

US 2008/0267245 A1    Oct. 30, 2008

Related U.S. Application Data

(62) Division of application No. 11/240,470, filed on Oct. 3, 2005, now Pat. No. 7,387,954.

(30) Foreign Application Priority Data

Oct. 4, 2004    (JP) ................. 2004-290968

(51) Int. Cl.
*G02B 6/12* (2006.01)
*G02B 6/26* (2006.01)

(52) U.S. Cl. .......................... 385/47; 385/14
(58) Field of Classification Search ............ 385/47, 385/14
See application file for complete search history.

(56) References Cited

U.S. PATENT DOCUMENTS

| | | |
|---|---|---|
| 5,080,474 A | 1/1992 | Miyamoto |
| 5,825,551 A | 10/1998 | Clarkson et al. |
| 5,900,980 A | 5/1999 | Yamazaki et al. |
| 6,038,075 A | 3/2000 | Yamazaki et al. |
| 6,104,535 A | 8/2000 | Tanaka |
| 6,137,633 A | 10/2000 | Tanaka |
| 6,157,492 A | 12/2000 | Yamazaki et al. |
| 6,212,012 B1 | 4/2001 | Tanaka |
| 6,215,595 B1 | 4/2001 | Yamazaki et al. |
| 6,239,913 B1 | 5/2001 | Tanaka |
| 6,291,320 B1 | 9/2001 | Yamazaki et al. |
| 6,300,176 B1 | 10/2001 | Zhang et al. |
| 6,304,385 B1 | 10/2001 | Tanaka |
| 6,310,727 B1 | 10/2001 | Tanaka |
| 6,388,812 B2 | 5/2002 | Yamazaki et al. |

(Continued)

FOREIGN PATENT DOCUMENTS

GB    2 044 948    10/1980

(Continued)

*Primary Examiner* — K. Cyrus Kianni
(74) *Attorney, Agent, or Firm* — Eric J. Robinson; Robinson Intellectual Property Law Office, P.C.

(57) ABSTRACT

The present invention is to provide a beam homogenizer, a laser irradiation apparatus, and a method for manufacturing a semiconductor device, which can suppress the loss of a laser beam and form a beam spot having homogeneous energy distribution constantly on an irradiation surface without being affected by beam parameters of a laser beam. A deflector is provided at an entrance of an optical waveguide or a light pipe used for homogenizing a laser beam emitted from a laser oscillator. A pair of reflection planes of the deflector is provided so as to have a tilt angle to an optical axis of the laser beam, whereby the entrance of the optical waveguide or the light pipe is expanded. Accordingly, the loss of the laser beam can be suppressed. Moreover, by providing an angle adjusting mechanism to the deflector, a beam spot having homogeneous energy distribution can be formed at an exit of the optical waveguide.

22 Claims, 14 Drawing Sheets

U.S. PATENT DOCUMENTS

| | | |
|---|---|---|
| 6,437,284 B1 | 8/2002 | Okamoto et al. |
| 6,441,965 B2 | 8/2002 | Yamazaki et al. |
| 6,563,843 B1 | 5/2003 | Tanaka |
| 6,689,651 B2 * | 2/2004 | Zhang et al. .................. 438/166 |
| 6,750,424 B2 | 6/2004 | Tanaka |
| 6,856,630 B2 | 2/2005 | Tanaka |
| 6,961,184 B2 | 11/2005 | Yamazaki et al. |
| 7,112,477 B2 | 9/2006 | Tanaka |
| 7,245,802 B2 * | 7/2007 | Tanaka ........................... 385/31 |
| 7,253,032 B2 | 8/2007 | Yamazaki et al. |
| 7,279,657 B2 | 10/2007 | Hegedus |
| 7,304,645 B2 | 12/2007 | Blask et al. |
| 7,312,473 B2 | 12/2007 | Koyama et al. |
| 7,327,916 B2 * | 2/2008 | Tanaka ........................... 385/31 |
| 2002/0196551 A1 | 12/2002 | Yamazaki et al. |
| 2004/0058553 A1 * | 3/2004 | Tanaka ........................... 438/710 |
| 2004/0213514 A1 * | 10/2004 | Tanaka et al. ................... 385/31 |
| 2005/0111105 A1 | 5/2005 | Tanaka |
| 2008/0267245 A1 * | 10/2008 | Tanaka et al. ................. 372/101 |

FOREIGN PATENT DOCUMENTS

| | | |
|---|---|---|
| JP | 08-338962 | * 10/1980 |
| JP | 08-338962 | 12/1996 |
| JP | 2002-184206 | 6/2002 |
| JP | 2003-017411 | 1/2003 |
| JP | 2004-134785 | 4/2004 |

* cited by examiner

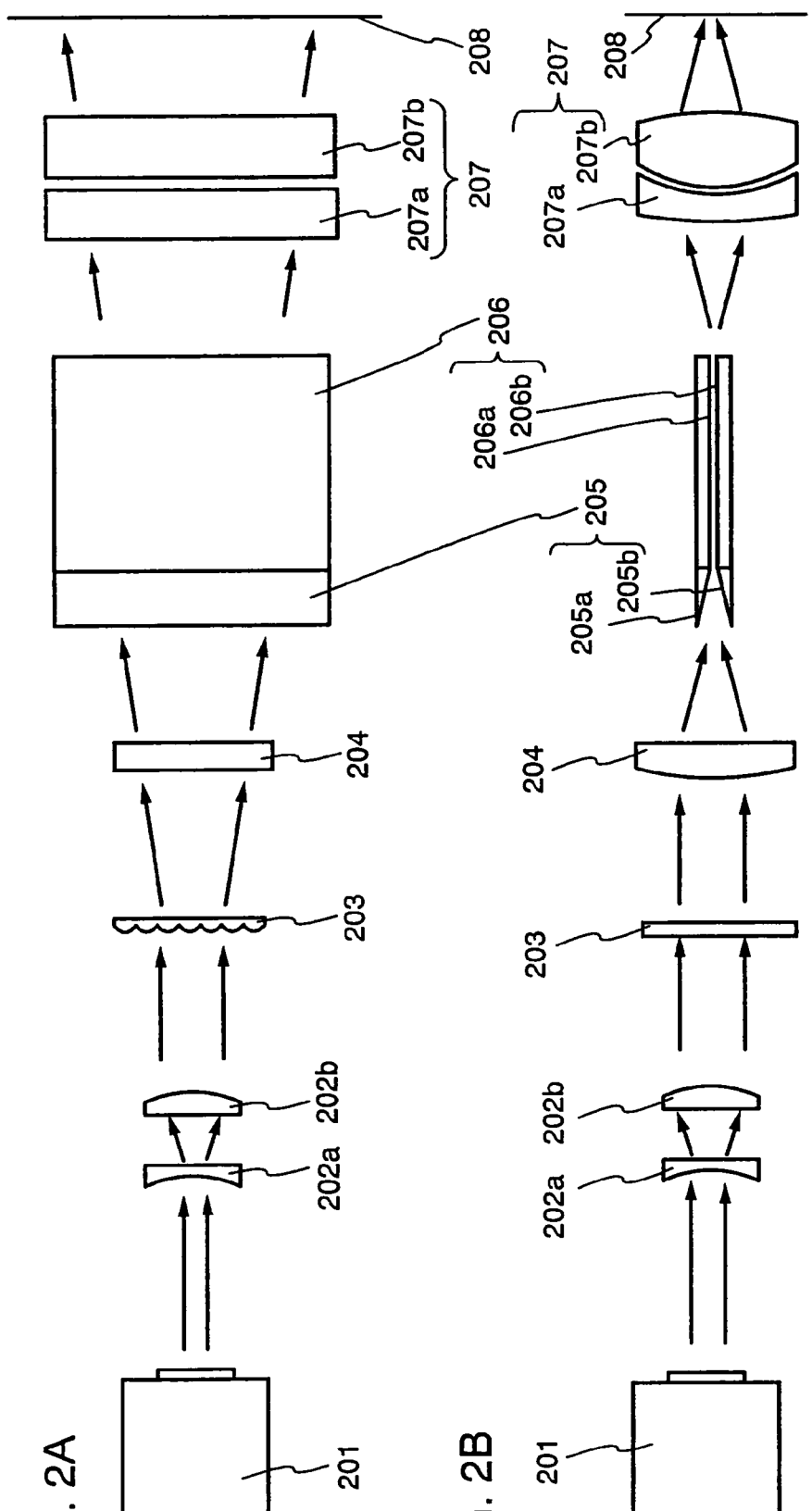

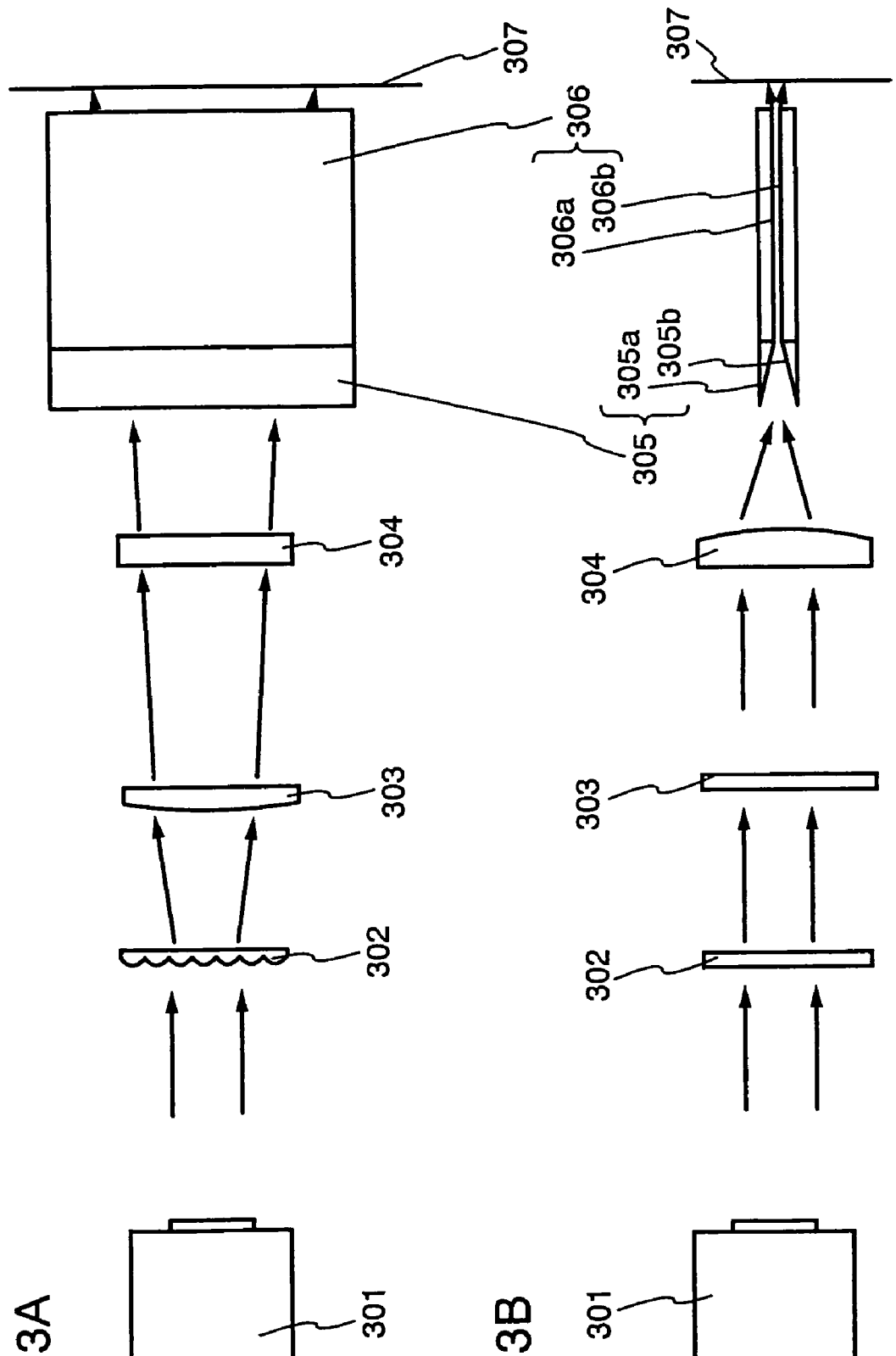

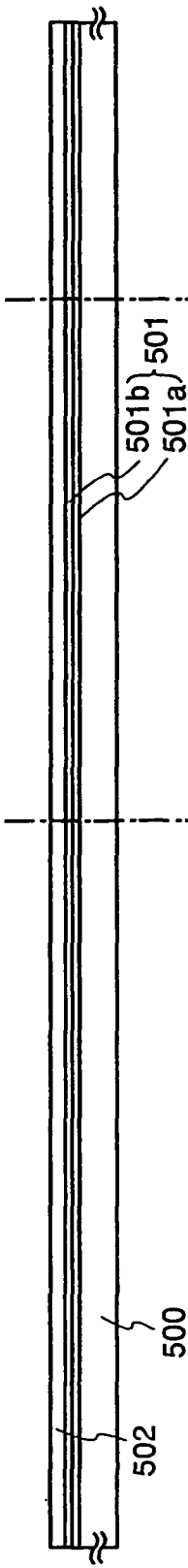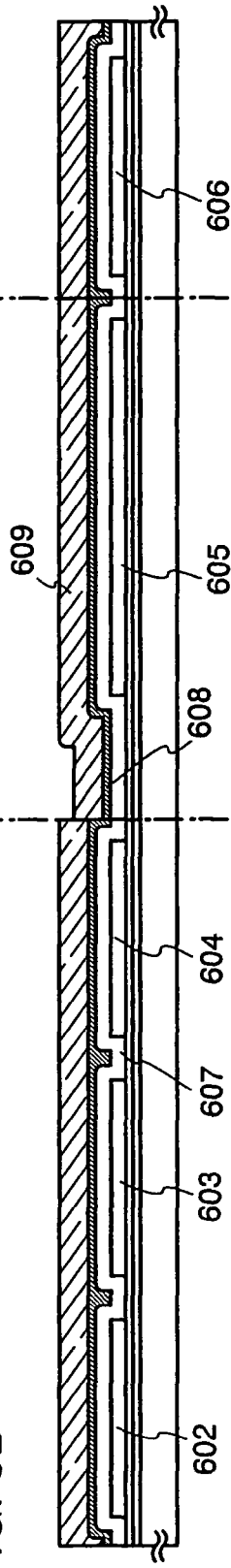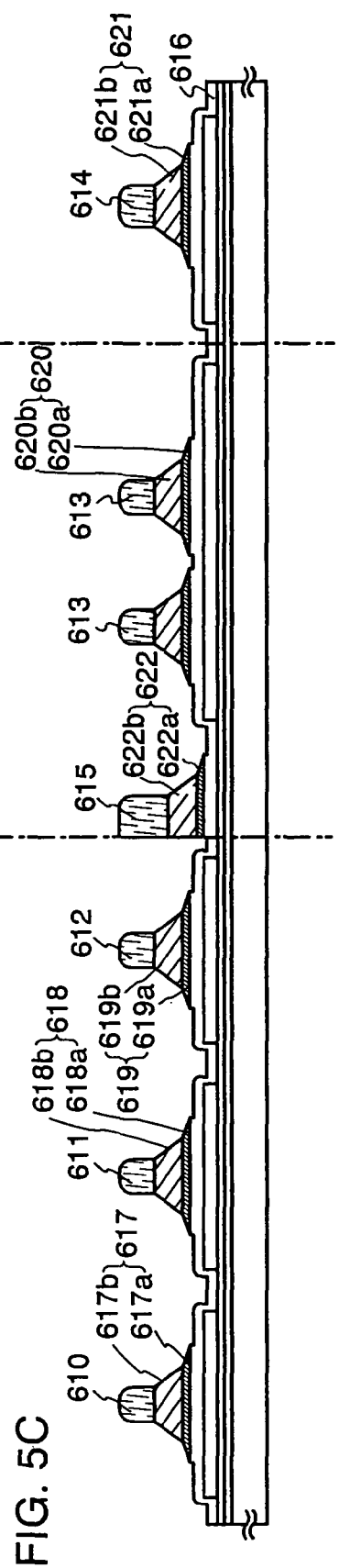

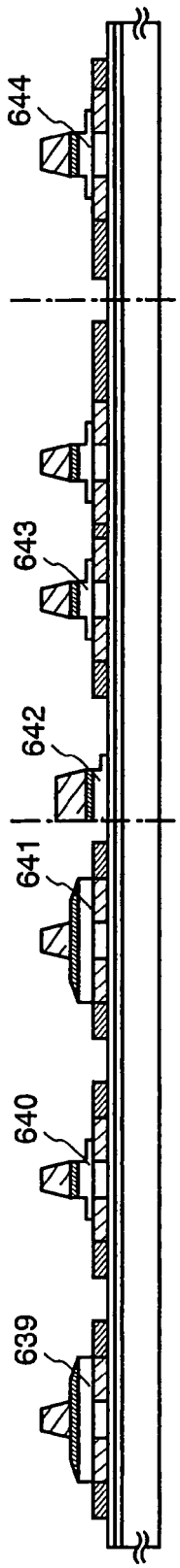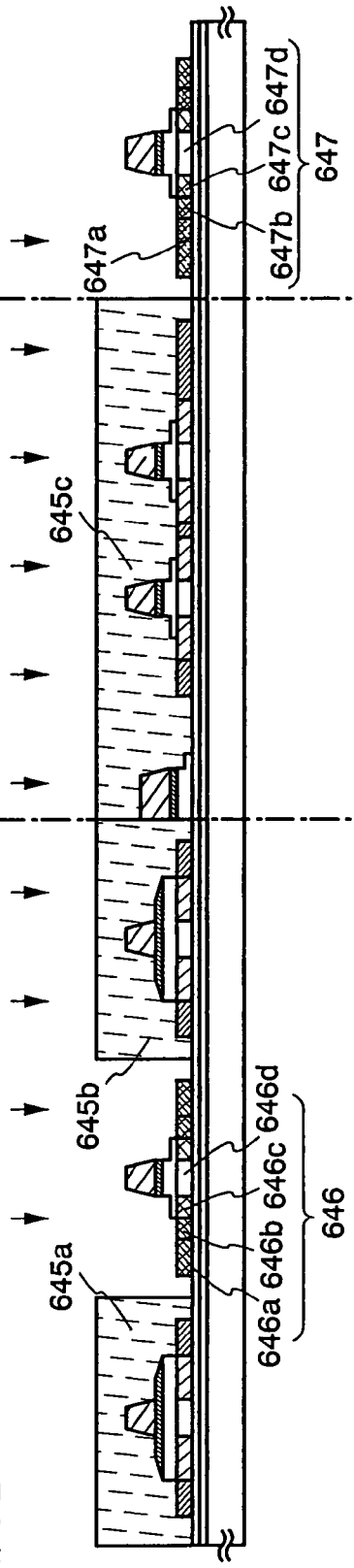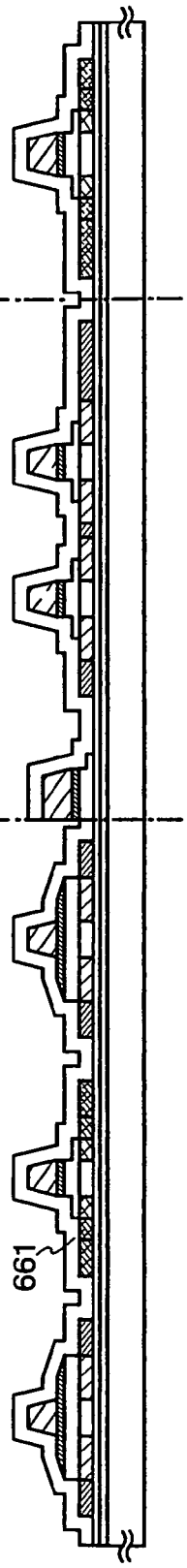

BEAM HOMOGENIZER, LASER IRRADIATION APPARATUS, AND METHOD FOR MANUFACTURING SEMICONDUCTOR DEVICE

BACKGROUND OF THE INVENTION

1. Field of the Invention

The present invention relates to a beam homogenizer for homogenizing energy distribution of a beam spot on an irradiation surface in a particular region. Further, the present invention relates to a laser irradiation apparatus equipped with a laser oscillator and the beam homogenizer, wherein a laser beam emitted from the laser oscillator is homogenized through the beam homogenizer and wherein an anneal process and the like are conducted by irradiating the irradiation surface with the beam spot. Furthermore, the present invention relates to a method for manufacturing a semiconductor device using the laser irradiation apparatus. It is to be noted that the semiconductor device includes a liquid crystal display device, a light-emitting device using electroluminescence (EL), an electronic optical device, and an electric appliance.

2. Related Art

A process of manufacturing a semiconductor device includes a step of crystallizing a semiconductor film over a glass substrate. The semiconductor film is crystallized by, for example, laser annealing. Since the laser annealing can give energy only to the semiconductor film locally, the laser annealing has an advantage of preventing softening of glass which has been a problem in annealing by conventional heat treatment.

In recent years, a laser oscillator having high output power has been employed with the increase in size of a substrate. A method is widely employed in which a laser beam with high output power typified by an excimer laser or the like is shaped into a linear beam spot on an irradiation surface by an optical system and an irradiation position of the beam spot is moved relative to the irradiation surface. With this method, high mass productivity can be obtained.

At the irradiation with the linear beam spot, the linear beam spot is delivered while being overlapped by displacing the beam spot gradually in a direction perpendicular to a line direction of the beam spot (the direction perpendicular to the line direction is hereinafter referred to as a width direction). By the irradiation while overlapping the beam spots, the growth of a crystal grain in the semiconductor film can be promoted and the characteristic such as electron mobility can be enhanced.

In the case of conducting the laser annealing of the semiconductor film, it is necessary to set the energy distribution and the energy density of the linear beam spot in the width direction to an optimum condition for the laser annealing. Furthermore, to conduct the laser annealing homogeneously to the semiconductor film, the fluctuation in the energy distribution and the energy density of the linear beam spot formed by the optical system needs to be suppressed. However, in the case of using a homogenizer including a cylindrical lens array, the position of a plane at which a homogeneous linear beam spot is obtained changes when a beam parameter such as a divergence angle fluctuates due to the change of a laser oscillation condition. As a result, a defect is found in which the energy distribution or the energy density of the linear beam spot on the irradiation surface fluctuates. Consequently, a beam homogenizer using an optical waveguide instead of the cylindrical lens array and a laser annealing apparatus having such a beam homogenizer mounted have been suggested (see, for example, Japanese Patent Application Laid-Open No. 2004-134785).

SUMMARY OF THE INVENTION

An optical waveguide is an optical path capable of confining a laser beam in a particular region and transmitting the laser beam. When an optical waveguide is used as the beam homogenizer, a laser beam entering the optical waveguide is repeatedly reflected inside the optical waveguide. Then, at an exit of the optical waveguide, a homogeneous plane where the energy of the laser beam is homogenized is formed. Since the area of the homogeneous plane is equal to the area of the exit of the optical waveguide, the area of the homogenous plane does not change. Therefore, an advantage is obtained in which the fluctuation of the energy density of the beam spot to be projected to the irradiation surface can be suppressed.

Here, a method for homogenizing the energy distribution of a beam spot by an optical waveguide is described with reference to FIGS. 14A and 14B. First, a side view of FIG. 14A is described. An irradiation surface 1203 and an optical waveguide 1202 having a pair of reflection planes 1202a and 1202b opposing to each other are prepared, and a laser beam enters from the left side on the paper. A ray 1201a when the optical waveguide 1202 exists is drawn with a solid line, while a ray 1201b when the optical waveguide 1202 does not exist is drawn with a dotted line. The ray 1201b entering from the left side on the paper when the optical waveguide 1202 does not exist reaches regions 1203a, 1203b, and 1203c on the irradiation surface 1203 as shown with the dotted line.

On the other hand, when the optical waveguide 1202 exists, as shown with the ray 1201a, the ray is reflected on the reflection planes of the optical waveguide 1202 and all the rays reach the region 1203b on the irradiation surface 1203. That is to say, the rays which are to reach the regions 1203a and 1203c on the irradiation surface 1203 when the optical waveguide 1202 does not exist all reach the region 1203b on the irradiation surface 1203 when the optical waveguide 1202 exists. In other words, the divergence of the incident ray is suppressed and the rays are superposed on the region 1203b. In this way, when the incident laser beam is divided and the divided laser beams are superposed on the same position, the energy distribution of the beam spot is homogenized at the superposed position. In this example, the total length of the divergence of the rays on the regions 1203a, 1203b, and 1203c when the optical waveguide does not exist is assumed as A and the length of the divergence of the ray on the region 1203b when the optical waveguide exists is assumed as B. Then, A/B is the division number of the laser beams, which corresponds to the number of the laser beams contributing to the homogenization on the irradiation surface.

Generally, the homogeneity of the energy distribution at the position where the divided laser beams are superposed becomes higher with the increase in the division number of the laser beams by a beam homogenizer. In order to increase the division number of the laser beams in the above optical waveguide 1202, the number of reflection times inside the optical waveguide 1202 may be increased. That is to say, the length of the pair of reflection planes of the optical waveguide 1202 in the direction where the ray is to enter may be extended. Moreover, the division number can be increased by reducing the distance between the pair of reflection planes opposing to each other or by increasing NA (numeral aperture) of the incident ray.

With the optical waveguide, the laser beam can be homogenized according to the above method. However, in an optical system using the optical waveguide, the laser beam needs to be condensed with a lens so as to have a size which is equal to or smaller than the distance between the reflection planes of the optical waveguide in order to make the laser beam enter the optical waveguide. Here, the change of an oscillation condition of a laser oscillator causes a beam parameter to change, which deteriorates the light-condensing characteristic of a laser beam. For example, when the repetition rate of the laser oscillator is increased, the divergence angle of the laser beam becomes large; therefore, the diameter of the beam spot at the condensed position cannot be made equal to or smaller than the distance between the reflection planes of the optical waveguide. Accordingly, all the laser beams cannot enter the optical waveguide, thereby losing some of the laser beam at the entrance of the optical waveguide. This problem becomes more serious when the distance between the pair of reflection planes opposing to each other of the optical waveguide is reduced in order to increase the homogeneity of the beam spot. In the case of conducting the laser annealing with an apparatus using the optical waveguide, it is necessary to prevent the loss of the laser beam caused by the change of the laser oscillation condition in order to keep the productivity as a mass-production apparatus.

The beam parameter such as the divergence angle changes depending on not only the laser oscillation condition but also a maintenance condition of a window of a laser oscillator or the like. In the case of forming a homogeneous plane at the exit of the optical waveguide, the optical waveguide needs to be set at an optimized position in consideration of the incidence angle of the laser beam entering the optical waveguide, the length of the optical waveguide, the distance between the pair of reflection planes of the optical waveguide, and so on. Here, when the beam parameter changes, the behavior of the laser beam inside the optical waveguide changes. Therefore, the homogeneous plane cannot be formed at the exit of the optical waveguide. As a result, the homogeneity of the energy distribution of the beam spot to be projected to the irradiation surface deteriorates.

The laser annealing needs to be conducted to a semiconductor film constantly under the same irradiation condition. However, when the energy distribution of the beam spot to be projected to the irradiation surface deteriorates due to the above reason, the laser annealing cannot be conducted to the semiconductor film under the same irradiation condition. Therefore, the above phenomenon becomes a problem in mass production of semiconductor devices.

Even in the case of using a light pipe instead of the optical waveguide, the problem in which the homogeneity of the energy distribution of the beam spot deteriorates or in which a part of the laser beam is lost occurs by the same reason. A light pipe is a transparent component having a shape of a cone, a pyramid, a cylinder, or the like which transmits a laser beam using total reflection by the difference of refractive index between the air, the material, and the like to homogenize the energy distribution.

In view of the above problems, it is an object of the present invention to provide a beam homogenizer which can form a homogeneous beam spot while suppressing the loss of a laser beam at an optical system as much as possible. Further, the present invention also provides a laser irradiation apparatus and a method for manufacturing a semiconductor device which use the beam homogenizer.

A beam homogenizer disclosed in the present invention comprises a deflector at an entrance of an optical waveguide, wherein the optical waveguide is provided parallel to an optical axis of a laser beam, and wherein the deflector has a pair of reflection planes tilted to the optical axis of the laser beam.

When the reflection planes of the deflector are tilted to the optical axis of the laser beam, the entrance for the laser beam can be expanded. For this reason, the loss of the laser beam can be prevented. The laser beam entering the deflector is deflected by the reflection planes tilted to the optical axis. The deflected laser beam enters the optical waveguide provided just behind the deflector.

The optical waveguide is provided so that its reflection planes to transmit the laser beam are parallel to the optical axis of the laser beam. The energy distribution of the laser beam becomes homogeneous as the laser beam is repeatedly reflected inside the optical waveguide. Here, in order to obtain the beam spot having high homogeneity at the exit of the optical waveguide, it is necessary to reduce as much as possible the distance between the reflection planes of the optical waveguide to transmit the laser beam. In this case, the laser beam needs to be condensed so as to be smaller than the distance between the reflection planes of the optical waveguide before entering the optical waveguide. However, in the present invention, since the laser beam is deflected by the deflector, the laser beam can be condensed at the entrance of the optical waveguide so as to have a size which is equal to or smaller than the distance between the reflection planes of the optical waveguide. This enables the laser beam to enter the optical waveguide effectively. With the above structure, the beam spot having high homogeneity can be obtained easily while preventing the loss of the laser beam.

According to another aspect of the present invention, a beam homogenizer comprises a cylindrical lens array, an optical waveguide, and a deflector, wherein the optical waveguide is provided parallel to an optical axis of a laser beam, wherein the deflector is provided at an entrance of the optical waveguide, and wherein the deflector has a pair of reflection planes tilted to the optical axis of the laser beam.

In the above structure of the beam homogenizer according to the present invention, a tilt angle θ of each of the reflection planes is set so as to satisfy $\alpha<\theta<(90°+\alpha)/2$ where α is a convergence angle of the laser beam.

In the above structure of the beam homogenizer according to the present invention, the optical waveguide has a pair of reflection planes opposing to each other.

In the above structure of the beam homogenizer according to the present invention, the deflector preferably has an angle adjusting mechanism for adjusting the tilt angle of each of the reflection planes.

By adjusting the tilt angle of each of the reflection planes of the deflector, the number of reflection times of the laser beam in the optical waveguide can be adjusted. For this reason, a beam spot having homogeneous energy distribution can be formed at the exit of the optical waveguide.

In the above structure of the beam homogenizer according to the present invention, the angle adjusting mechanism is, for example, a goniometer or a manipulator.

In the above structure of the beam homogenizer according to the present invention, the beam spot preferably has an aspect ratio of 100 or more.

According to another aspect of the beam homogenizer disclosed in the present invention, a light pipe is used instead of the optical waveguide. The light pipe is generally a transparent component having a shape of a cone, a pyramid, a cylinder, or the like which sends light from one end to the other end by total reflection. The light may be sent by reflection on a mirror.

A laser irradiation apparatus disclosed in the present invention comprises a laser oscillator and a beam homogenizer, wherein the beam homogenizer has an optical waveguide and a deflector, wherein the optical waveguide is provided parallel to an optical axis of a laser beam, wherein the deflector is provided at an entrance of the optical waveguide, and wherein the deflector has a pair of reflection planes tilted to the optical axis of the laser beam.

In the above structure of the laser irradiation apparatus according to the present invention, the optical waveguide has a pair of reflection planes opposing to each other.

In the above structure of the laser irradiation apparatus according to the present invention, the deflector preferably has an angle adjusting mechanism to adjust the tilt angle of each of the reflection planes.

In the above structure of the laser irradiation apparatus according to the present invention, the laser oscillator is any one of an excimer laser, a YAG laser, a glass laser, a $YVO_4$ laser, a YLF laser, and an Ar laser.

In the above structure of the laser irradiation apparatus according to the present invention, the angle adjusting mechanism is, for example, a goniometer or a manipulator.

In the above structure of the laser irradiation apparatus according to the present invention, the beam spot preferably has an aspect ratio of 100 or more.

According to another aspect of the laser irradiation apparatus disclosed in the present invention, a light pipe is used instead of the optical waveguide in the beam homogenizer.

A method for manufacturing a semiconductor device disclosed in the present invention comprises the steps of forming a non-single crystal semiconductor film over a substrate, homogenizing energy distribution of a laser beam emitted from a light source on an irradiation surface by a cylindrical lens array, a deflector, and an optical waveguide, setting the substrate with the non-single crystal semiconductor film formed onto a stage, corresponding the surface of the non-single crystal semiconductor film to the irradiation surface, moving the stage relative to the laser beam while delivering the laser beam, and conducting laser annealing to the non-single crystal semiconductor film.

In the above structure of the method for manufacturing a semiconductor device according to the present invention, the laser beam is shaped into a rectangular beam spot having homogenous energy distribution on the irradiation surface, the energy distribution in a long-side direction of the rectangular beam spot is homogenized by the cylindrical lens array, and the energy distribution in a short-side direction of the rectangular beam spot is homogenized by the optical waveguide.

In the above structure of the method for manufacturing a semiconductor device according to the present invention, the optical waveguide is provided parallel to the optical axis of the laser beam, the deflector is provided at an entrance of the optical waveguide, and the deflector has a pair of reflection planes tilted to the optical axis of the laser beam.

In the above structure of the method for manufacturing a semiconductor device according to the present invention, the optical waveguide has a pair of reflection planes opposing to each other.

In the above structure of the method for manufacturing a semiconductor device according to the present invention, the deflector preferably has an angle adjusting mechanism to adjust the tilt angle of each of the reflection planes.

In the above structure of the method for manufacturing a semiconductor device according to the present invention, the laser oscillator is any one of an excimer laser, a YAG laser, a glass laser, a $YVO_4$ laser, a YLF laser, and an Ar laser.

In the above structure of the method for manufacturing a semiconductor device according to the present invention, the angle adjusting mechanism is, for example, a goniometer or a manipulator.

In the above structure of the method for manufacturing a semiconductor device according to the present invention, the beam spot has an aspect ratio of 100 or more.

According to another aspect of the method for manufacturing a semiconductor device disclosed in the present invention, a light pipe is used instead of the optical waveguide used for homogenizing the energy distribution of the laser beam.

In a beam homogenizer according to the present invention, a deflector is provided at an entrance of an optical waveguide or a light pipe used for homogenizing a laser beam emitted from a laser oscillator, and the deflector has a pair of reflection planes provided so as to have a tilt angle to an optical axis of the laser beam. Accordingly, an entrance of the optical waveguide or the light pipe can be expanded. For this reason, the loss of the laser beam at the entrance can be prevented. Moreover, by deflecting the laser beam with the deflector, the laser beam can enter the optical waveguide or the light pipe through a narrow space between the reflection planes while preventing the loss of the laser beam. As a result, the beam spot having high homogeneity can be easily obtained. Further, by adjusting the tilt angle of each of the reflection planes of the deflector, the energy distribution of the beam spot on the irradiation surface can be adjusted. With these advantages, even though the oscillation condition changes due to the change of the repetition rate or the like, the loss of the laser beam at the optical waveguide or the light pipe can be prevented and the energy of the laser beam can be used effectively. Moreover, the beam spot having homogenous energy distribution can be formed.

Further, when the rectangular beam spot emitted from the laser irradiation apparatus equipped with the above beam homogenizer is moved in a short-side direction of the rectangular beam spot relative to a semiconductor film, the semiconductor film can be effectively annealed under a constant condition. Moreover, the inhomogeneity of the crystallinity due to the inhomogeneity of the energy distribution of the beam spot can be suppressed, which can increase the homogeneity of the crystallinity within the substrate. Further, high stability as the laser irradiation apparatus can be secured, and the running cost can be decreased because the loss of the laser beam can be prevented. By applying the present invention to a mass-production line of low-temperature poly-silicon TFTs, TFTs with high operating characteristics can be manufactured effectively.

BRIEF DESCRIPTION OF THE DRAWINGS

In the Accompanying Drawings:

FIGS. 2A and 2B show an example of a laser irradiation apparatus disclosed in the present invention;

FIGS. 3A and 3B show an example of a laser irradiation apparatus disclosed in the present invention;

FIGS. 5A to 5C are cross-sectional views showing steps of manufacturing a pixel TFT and a driver circuit;

FIGS. 7A to 7C are cross-sectional views showing steps of manufacturing a pixel TFT and a driver circuit;

DETAILED DESCRIPTION OF THE INVENTION

Embodiment Mode

Figure 1A:
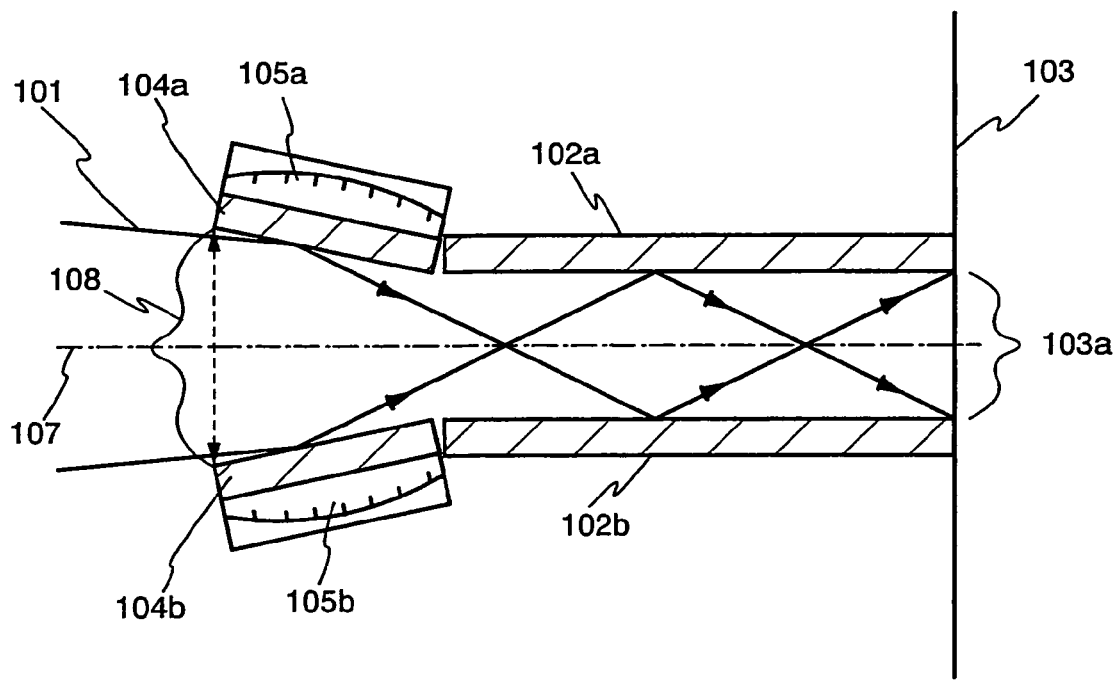
FIGS. 1A and 1B show an example of an optical waveguide disclosed in the present invention.
Figure 1B:
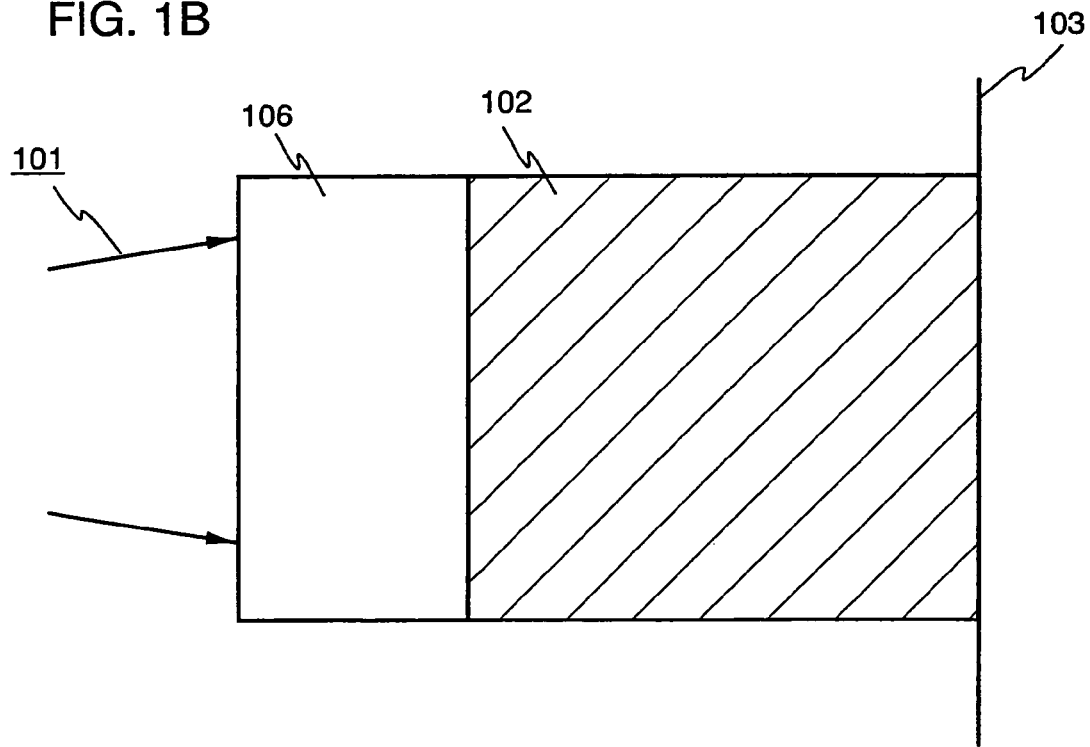

A beam homogenizer according to the present invention has a deflector at an entrance of an optical waveguide. It is to be noted that the deflector has a pair of reflection planes opposing to each other. FIGS. 1A and 1B show a beam homogenizer disclosed in the present invention. A deflector 106 has a pair of reflection planes 104a and 104b. The reflection planes 104a and 104b are set so as to tilt to an optical axis 107 of a laser beam. This makes a distance 108 between the reflection planes 104a and 104b of the deflector 106 larger than the size of a beam spot formed by condensing the laser beam. In FIGS. 1A and 1B, a ray 101 is to enter an optical waveguide 102, and all the rays deflected by the reflection planes 104a and 104b enter the optical waveguide 102. The optical waveguide 102 has a pair of reflection planes 102a and 102b, and the rays reflected on the reflection planes 102a and 102b reach a region 103a on an irradiation surface 103.

The tilt angle θ of each of the reflection planes 104a and 104b is set so that all the deflected rays enter the optical waveguide 102. The tilt angle θ of each of the reflection planes 104a and 104b is preferably set so as to satisfy $\alpha<\theta<(90°+\alpha)/2$ where $\alpha$ is a convergence angle of the laser beam. However, since it is necessary to consider the behavior of the laser beam as that of a Gaussian beam at and near the beam waist where the laser beam converges, the actual tilt angle is preferably adjusted while confirming that there is no loss of the laser beam with the use of a power meter or the like.

Further, the tilt angle is adjusted so that the energy of the beam spot formed at the exit of the optical waveguide 102 is homogenized. The tilt angle of each of the reflection planes 104a and 104b is adjusted by angle adjusting means 105a and 105b such as a goniometer to which the reflection planes 104a and 104b are provided. By adjusting the angle of each of the reflection planes 104a and 104b, the number of reflection times of the ray in the optical waveguide 102 can be adjusted. The homogeneity of the energy distribution of the beam spot at the exit of the optical waveguide 102 needs to be optimized in consideration of the length of the optical waveguide 102 in the direction where the ray is to enter, the distance between the reflection planes 102a and 102b, the incidence angle of the laser beam, and so on.

In particular, the tilt angle of each of the reflection planes 104a and 104b is adjusted so that the laser beams are superposed at the exit of the optical waveguide. The laser beams are superposed when the following inequality (1) is satisfied:

$$\tan(2\theta'-\alpha)-\tan(2\theta-\alpha)>d/L \quad (1)$$

where θ is the minimum tilt angle of each of the reflection planes 104a and 104b, θ' is the maximum tilt angle thereof, L is the length of the optical waveguide 102 in the direction where the ray is to enter, and d is the distance between the reflection planes 102a and 102b. Since the length L is usually several tens to several hundred times larger than the distance d, the range of the tilt angle satisfying the inequality (1), which is θ'-θ, is approximately several degrees. When an angle adjusting mechanism can operate in the above angle range, a homogeneous beam can be formed at the exit of the optical waveguide. It is preferable to adjust the angle by a beam profiler provided at the exit of the optical waveguide while observing the beam profile of the beam spot. With the above structure, the loss of the laser beam at the entrance of the optical waveguide can be prevented and simultaneously the homogeneous beam spot can be formed at the exit of the optical waveguide.

Next, a laser irradiation apparatus disclosed in the present invention for forming a rectangular beam spot on an irradiation surface is described with reference to FIGS. 2A and 2B. First, a top view of FIG. 2A is described. A laser beam emitted from a laser oscillator 201 travels in a direction indicted by an arrow in FIG. 2A. The laser beam is first expanded by spherical lenses 202a and 202b. This structure is not necessary when the beam spot emitted from the laser oscillator 201 is sufficiently large.

The beam spot of the expanded laser beam is divided in a long-side direction of a rectangle by a cylindrical lens array 203. The cylindrical lens array 203 has cylindrical lenses arranged in a direction of the curvature. In this embodiment mode, a cylindrical lens array having seven cylindrical lenses arranged is used. This homogenizes the energy distribution in the long-side direction of the rectangular beam spot. Moreover, a cylindrical lens for combining the laser beams divided by the cylindrical lens array 203 may be provided behind the cylindrical lens array 203.

The laser beam passed through the cylindrical lens array 203 enters a deflector 205 provided behind. After that, the laser beam enters an optical waveguide 206 and the laser beam emitted from the optical waveguide 206 is delivered to an irradiation surface 208.

Next, a side view of FIG. 2B is described. The laser beam emitted from the laser oscillator 201 travels in a direction of the arrow in FIG. 2B. First, the laser beam is expanded by the spherical lenses 202a and 202b. This structure is not necessary when the beam spot emitted from the laser oscillator 201 is sufficiently large.

The laser beam is condensed by a cylindrical lens 204 in a short-side direction of the rectangle and enters the deflector 205 provided behind the cylindrical lens 204. The deflector 205 has a pair of reflection planes 205a and 205b opposing to each other, and the distance between the reflection planes 205a and 205b is long at the entrance and becomes shorter toward the optical waveguide 206. With this structure, the laser beam can enter the optical waveguide 206 while preventing the loss of the laser beam. The optical waveguide 206 has a pair of reflection planes 206a and 206b opposing to each other. The optical waveguide 206 homogenizes the energy distribution of the beam spot in a short-side direction of the rectangle to form a homogeneous beam spot at the exit of the optical waveguide 206.

The optical waveguide 206 has, for example, a length of 300 mm in the direction where the laser beam is to enter and a distance between the reflection planes of 0.4 mm. The energy distribution becomes more homogeneous as the length of the optical waveguide 206 in the direction where the laser beam is to enter is longer, the distance between the reflection planes is shorter, and the focal length of the cylindrical lens 204 is shorter.

The homogeneous beam spot formed at the exit of the optical waveguide 206 is projected to the irradiation surface 208 by a doublet cylindrical lens 207. That is to say, the homogeneous beam spot and the irradiation surface 208 are conjugate planes to the doublet cylindrical lens 207. The doublet cylindrical lens 207 is a lens consisting of two cylindrical lenses 207a and 207b. The energy distribution of the rectangular beam spot is homogenized in the short-side direction and the length thereof in the short-side direction is determined by the optical waveguide 206 and the doublet cylindrical lens 207. If the homogeneity of the beam spot on the irradiation surface is not required that much or an F number of the doublet cylindrical lens is extremely high, a singlet cylindrical lens may be used.

The advantage in using the beam homogenizer according to the present invention is that the homogeneous plane is completely fixed by an optical system. In other words, since the homogeneous plane is formed at the exit of the beam homogenizer, the position of the homogeneous plane does not change even though the characteristic of the beam emitted from the laser oscillator changes for each pulse and by maintenance or the like. Briefly, the homogeneous plane is not easily affected by pointing stability. Accordingly, the homogeneous beam not affected by the change in the condition of the laser oscillator can be formed on the irradiation surface.

The laser oscillator used in combination with the beam homogenizer of the present invention preferably has high output power and a wavelength which is sufficiently absorbed in a semiconductor film. In the case of using a silicon film as the semiconductor film, the wavelength of the laser beam emitted from the laser oscillator is preferably 600 nm or less in consideration of the absorption ratio. As the laser oscillator emitting such a laser beam, for example, an excimer laser, a YAG laser (harmonic), a glass laser (harmonic), or the like is given.

Although high output power is not yet achieved by a current technique, a $YVO_4$ laser (harmonic), a YLF laser (harmonic), an Ar laser, or the like can be used as the laser oscillator emitting the laser beam having a wavelength appropriate for crystallizing the silicon film.

A method for manufacturing a semiconductor device of the present invention using a laser irradiation apparatus equipped with a beam homogenizer of the present invention is hereinafter described. First, a glass substrate having a size of 600× 720×0.7 mm is prepared. A substrate having enough resistance against heat up to 600° C. is used as this substrate. A silicon oxide film is formed in 200 nm thick as a base film over the glass substrate. Moreover, an amorphous silicon film of 55 nm thick is formed thereover. These films are formed by a sputtering method or a plasma CVD method.

The substrate with the films formed is heated at 450° C. for an hour in a nitrogen atmosphere. This step is to decrease the concentration of hydrogen in the amorphous silicon film and conducted because the film containing too much hydrogen cannot resist the laser energy. The concentration of hydrogen in the film is appropriate $10^{20}/cm^3$ or more and less than $10^{21}/cm^3$. Here, $10^{20}/cm^3$ means $10^{20}$ number of hydrogen atoms exist in 1 $cm^3$.

In this embodiment mode, the laser oscillator is STEEL 1000 (XeCl excimer laser) manufactured by Lambda Physics, Inc. This excimer laser is a pulsed laser having a maximum energy of 1,000 mJ per pulse, an oscillation wavelength of 308 nm, and a maximum repetition rate of 300 Hz. When the energy of a pulsed laser beam fluctuates within ±5%, preferably within ±2%, in each pulse during the laser processing performed to one substrate, it is possible to perform homogeneous crystallization.

The fluctuation of the laser energy described here is defined as follows. The average value of the laser energy in the period of irradiating one substrate is assumed to be standard. Then, the fluctuation of the laser energy is defined as the value expressing the difference between the average value and the maximum or minimum value in the period of the irradiation in percentage terms.

The laser beam is delivered in such a way that a stage with the irradiation surface 208 shown in FIGS. 2A and 2B mounted thereon is moved in the short-side direction of the rectangular beam spot. The energy density and the scanning speed of the beam spot on the irradiation surface may be determined appropriately. It is feasible to perform laser annealing homogeneously when the energy density ranges from 300 to 1,000 $mJ/cm^2$ and the scanning speed is selected in the range where the width of the rectangular beam spot in its short-side direction overlaps with each other for approximately 90% or more. The optimum scanning speed depends on the pulse repetition rate of the laser oscillator and may be regarded to be proportional to the pulse repetition rate thereof.

Thus, the laser annealing step is completed. When the above step is performed repeatedly, many substrates can be processed. The substrate processed thus can be utilized to manufacture, for example, a liquid crystal display device or a light-emitting device according to a known method.

The above example employs the excimer laser as the laser oscillator. Since the excimer laser has coherence length as short as several micrometers, the excimer laser is suitable for the above optical system. Although some of the lasers shown below have long coherence length, the laser whose coherence length has been changed deliberately may be employed. It is also preferable to use a harmonic of a YAG laser or a harmonic of a glass laser because high output power can be obtained similarly and the energy of the laser beam is sufficiently absorbed in the silicon film. As the laser oscillator appropriate for the crystallization of the silicon film, a $YVO_4$ laser (harmonic), a YLF laser (harmonic), an Ar laser, and the like are given. The wavelengths of these laser beams are sufficiently absorbed in the silicon film.

The above example employs the amorphous silicon film as the non-single crystal semiconductor film. However, it is easily supposed that the present invention can also be applied to another non-single crystal semiconductor film. For example, a compound semiconductor film having an amorphous structure such as an amorphous silicon germanium film may be employed as the non-single crystal semiconductor film. Alternatively, a poly-crystalline silicon film may be used as the non-single crystal semiconductor film.

Embodiment 1

This embodiment describes an example of a laser irradiation apparatus using a different optical system from the optical system described in Embodiment Mode. FIGS. 3A and 3B show the example of the laser irradiation apparatus described in this embodiment. First, a side view of FIG. 3B is described. A laser beam emitted from a laser oscillator 301 travels in a direction indicated by an arrow in FIG. 3B. The beam spot is condensed in a short-side direction of a rectangle by a cylindrical lens 304 of 10 mm thick whose second surface has a radius of curvature of −182 mm. A deflector 305 having a pair of reflection planes 305a and 305b opposing to each other is provided at a focal point of the cylindrical lens 304. The reflection planes 305a and 305b are tilted with an angle of 5° to an optical axis of the laser beam. The reflection planes 305a and 305b are 1.2 mm apart at the position where the laser beam enters. The laser beam deflected by the deflector 305 enters an optical waveguide 306, thereby homogenizing the energy distribution of the beam spot. The optical waveguide 306 has a pair of reflection planes 306a and 306b and has a length of 300 mm in a direction where the ray travels. The reflection planes 306a and 306b are provided to have a distance of 0.4 mm therebetween. An irradiation surface 307 is set 0.2 mm away from the exit of the optical waveguide 306. Then, a rectangular beam spot having homogeneous energy distribution and having a length of 0.4 mm in the short-side direction is formed on the irradiation surface 307.

Next, a top view of FIG. 3A is described. The laser beam emitted from the laser oscillator 301 travels in the direction indicated by the arrow in FIG. 3A. The laser beam passes through a cylindrical lens array 302 having seven cylindrical lenses connected in a direction of the curvature. Each cylindrical lens has a width of 3 mm and a first surface having a radius of curvature of +35 mm. The laser beams divided by the cylindrical lens array 302 in a long-side direction of the rectangle pass through a cylindrical lens 303 of 5 mm thick whose first surface has a radius of curvature of +816 mm and the laser beams are superposed on the irradiation surface 307. This forms the rectangular beam spot having homogeneous energy distribution in the long-side direction of the rectangle. When the cylindrical lens 303 has long focal length, the cylindrical lens 303 is not necessarily provided because the condensing capability decreases. According to the optical system shown in FIGS. 3A and 3B, the rectangular beam spot which has a length of 0.4 mm in the short-side direction and a length of 300 mm in the long-side direction and homogeneous energy distribution can be formed.

By using the optical system shown in this embodiment, for example according to the method shown in Embodiment Mode, laser annealing is conducted to the semiconductor film. With this semiconductor film, for example, a liquid crystal display device or a light-emitting device can be manufactured.

Embodiment 2

Figure 4A:
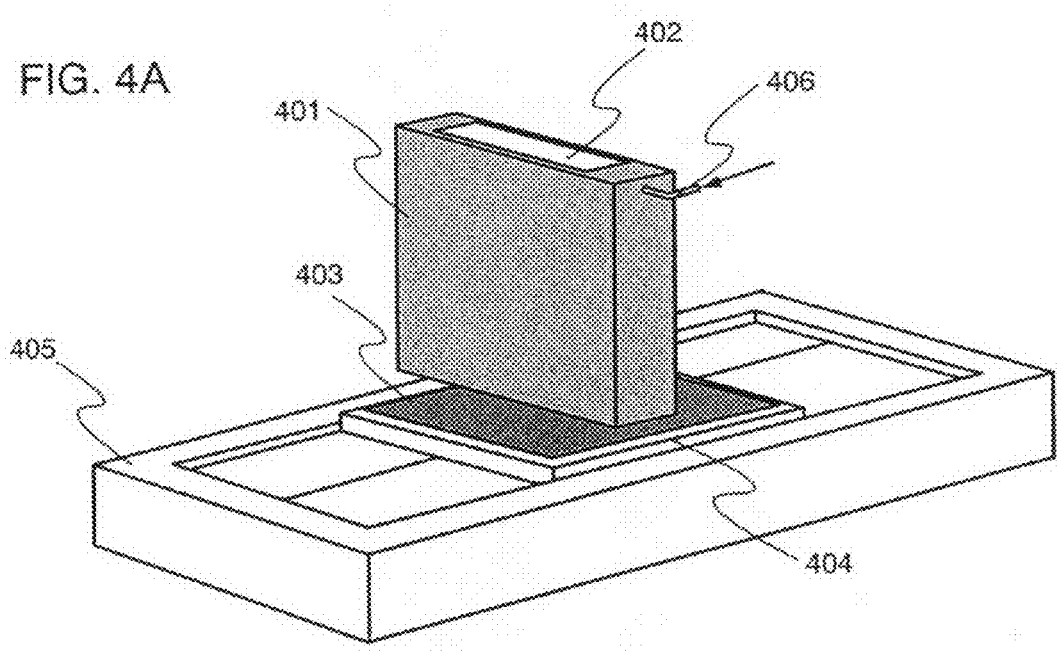
FIGS. 4A and 4B show an example of a laser irradiation apparatus disclosed in the present invention.
Figure 4B:
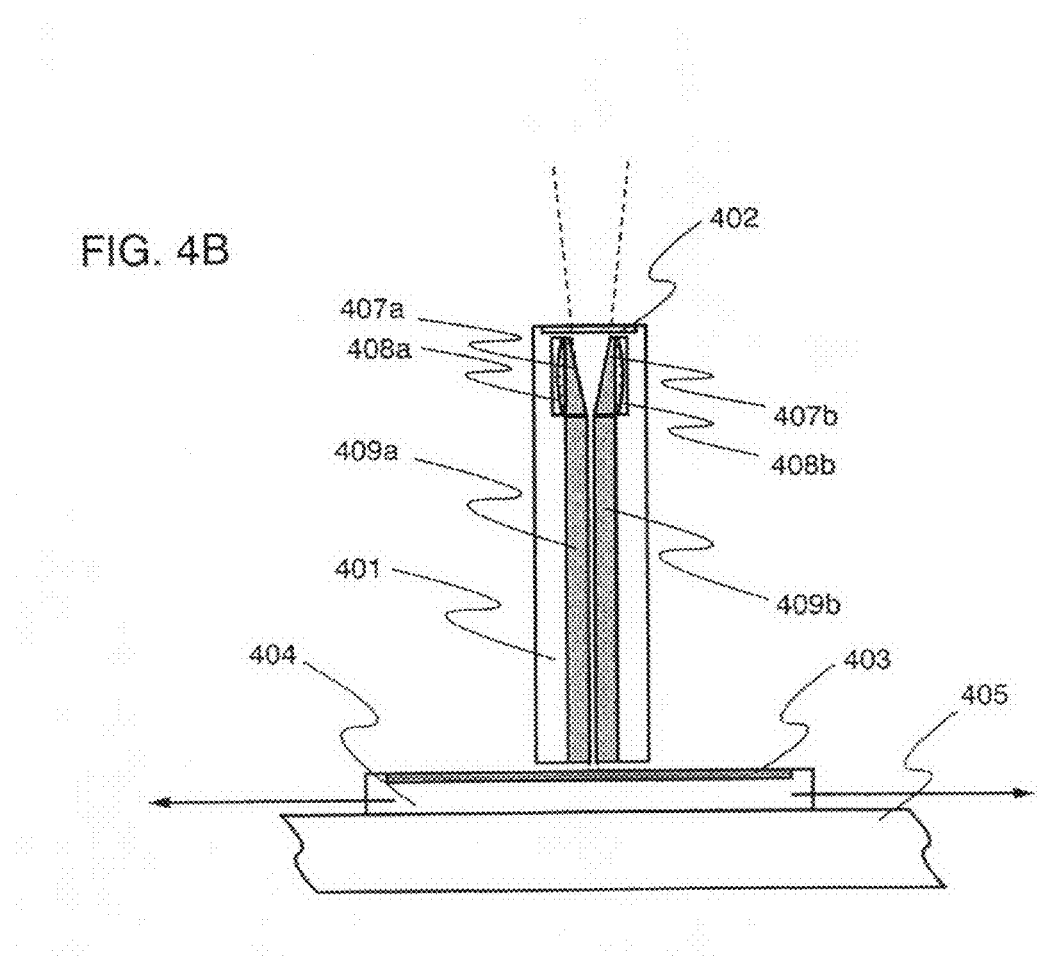

This embodiment shows an example of conducting laser annealing to a semiconductor film by the laser irradiation apparatus shown in Embodiment 1. FIGS. 4A and 4B show an example of the laser irradiation apparatus described in this embodiment. First, a cross-sectional view of FIG. 4B is described.

A laser beam passed through a quartz plate 402 enters a deflector having a pair of reflection planes 407a and 407b opposing to each other. The laser beam deflected by the reflection planes 407a and 407b enter an optical waveguide including a pair of reflection planes 409a and 409b, thereby homogenizing the beam spot. It is to be noted that the reflection planes 407a and 407b are provided onto goniometers 408a and 408b respectively. Each of the goniometers 408a and 408b serving as an angle adjusting mechanism has a rotation center above a stage. The reflection planes 407a and 407b can be tilted to an optical axis of the laser beam by rotating the goniometers 408a and 408b along the rotation center. All the laser beams enter the optical waveguide by adjusting the tilt angle of the reflection planes 407a and 407b with the use of the goniometers 408a and 408b to adjust the deflecting direction of the laser beam. Moreover, a homogeneous beam is formed at the exit of the optical waveguide. Instead of the goniometer, a manipulator capable of freely adjusting the angle may be used.

The laser beam homogenized by the optical waveguide is delivered to a substrate 403 set on a substrate holder 404. The substrate holder 404 is provided on a delivery stage 405. By moving the substrate holder 404 in the short-side direction of the rectangular beam spot, the whole surface of the substrate can be irradiated with the laser beam.

The condition of the process such as the energy density of the beam spot on the irradiation surface and the scanning speed may be determined appropriately. It is feasible to perform laser annealing homogeneously when the energy density ranges from 300 to 1,000 mJ/cm$^2$ and the scanning speed is selected in the range where the width of the rectangular beam spot in its short-side direction overlaps with each other for approximately 90% or more. The optimum scanning speed depends on the pulse repetition rate of the laser oscillator and may be regarded to be proportional to the pulse repetition rate thereof.

Next, a perspective view of FIG. 4A is described. The reflection planes 407a and 407b and the goniometers 408a and 408b which constitute the deflector, and the reflection planes 409a and 409b which constitute the optical waveguide are covered with a mount 401. The mount 401 has a tube 406 connected thereto through which inert gas flows into the optical waveguide. The optical waveguide has a structure in which parts except the exit are sealed. Accordingly, the inert gas flowed from the tube 406 flows out from the exit of the optical waveguide. The inert gas is sprayed to the region irradiated with the laser beam on the substrate. A laser irradiation method in which the inert gas is sprayed may be conducted according to, for example, a method described in Japanese Patent Application Laid-Open No. 2003-17411. The above method provides an advantage in that the surface of the semiconductor film can be flattened.

The beam parameter of the laser beam emitted from the laser oscillator, such as the divergence angle, changes depending on the deterioration of the gas inside the resonator of the laser oscillator, the repetition rate, and so on. When the beam parameter drastically changes over time, it is expected that the irradiation condition varies on the object in accordance with the change of the beam parameter. In such a case, the angle of the reflection plane of the deflector may be adjusted so as to offset the change of the beam spot formed on the irradiation surface. By applying the laser irradiation apparatus of the present invention, the laser irradiation condition can be made constant by a comparatively simple angle adjusting mechanism such as the above goniometer.

The laser annealing of the semiconductor film is conducted using the laser irradiation apparatus shown in this embodiment according to, for example, the method shown in Embodiment Mode. With this semiconductor film, for example, a liquid crystal display device or a light-emitting device can be manufactured.

Embodiment 3

This embodiment describes a method for manufacturing an active matrix substrate with reference to FIGS. 5A to 7C.

First of all, a substrate 500 made of glass such as barium borosilicate glass or aluminoborosilicate glass, typically #7059 glass or #1737 glass manufactured by Corning, Inc., is used. It is to be noted that a quartz substrate, a silicon substrate, a metal substrate, or a stainless steel substrate each of which has an insulating film formed thereover may also be used as the substrate 500. Moreover, a plastic substrate that can resist the heat generated in the process in this embodiment may be used.

Next, an insulating film such as a silicon oxide film, a silicon nitride film, or a silicon oxynitride film is formed over the substrate 500 as a base film 501. Although the base film 501 is formed in a two-layer structure in this embodiment, the base film 501 may be formed with the insulating film in a single-layer structure or a multilayer structure of two or more layers. As a first layer of the base film 501, a silicon oxynitride film 501*a* is formed in thickness from 10 to 200 nm (preferably from 50 to 100 nm) by a plasma CVD method using $SiH_4$, $NH_3$, and $N_2O$ as reacting gas. In this embodiment, a silicon oxynitride film 501*a* (composition ratio: Si=32%, O=27%, N=24%, H=17%) having a thickness of 50 nm is formed. Subsequently, a silicon oxynitride film 501*b* is formed in thickness from 50 to 200 nm (preferably from 100 to 150 nm) as a second layer of the base film 501 by a plasma CVD method using $SiH_4$ and $N_2O$ as reacting gas. In this embodiment, the silicon oxynitride film 501*b* (composition ratio: Si=32%, O=59%, N=7%, H=2%) having a thickness of 100 nm is formed.

Next, a semiconductor film 502 is formed over the base film. As the semiconductor film 502, a semiconductor film having an amorphous structure is formed in thickness from 25 to 80 nm (preferably from 30 to 60 nm) by a known means (such as a sputtering method, an LPCVD method, or a plasma CVD method). The material for the semiconductor film is not limited; however, it is preferable to use silicon or silicon germanium (SiGe) alloy. Next, a crystalline semiconductor film obtained by performing a laser crystallization method is patterned into a desired shape so as to form semiconductor layers 602 to 606. Besides the laser crystallization method, the laser crystallization method may be combined with another known crystallization process (such as an RTA method, a thermal crystallization method using an annealing furnace or the like, or a thermal crystallization method using catalyst such as nickel).

In the laser crystallization method, a pulsed or continuous wave excimer laser, YAG laser, $YVO_4$ laser, or the like can be used. In the case of using such a laser, it is preferable to use a method in which a laser beam emitted from the laser oscillator is condensed into a linear beam by an optical system and then delivered to the semiconductor film. The condition of the crystallization is appropriately selected. When the excimer laser is used, the pulse repetition rate is set in the range of 30 to 300 Hz, the laser energy density is set in the range of 100 to 800 mJ/cm$^2$ (typically in the range of 200 to 700 mJ/cm$^2$). In the case of using a YAG laser, the second harmonic is used and the pulse repetition rate is set in the range of 1 to 10,000 Hz and the laser energy density is set in the range of 300 to 1,000 mJ/cm$^2$ (typically in the range of 350 to 800 mJ/cm$^2$). Then, a laser beam condensed into a linear shape having a width of 100 to 1,000 μm, for example 400 μm, is delivered to the whole surface of the substrate.

A plasma CVD method is employed in this embodiment to form an amorphous silicon film of 55 nm thick. Then, a crystalline silicon film is formed by a laser crystallization method to which the laser irradiation method according to the present invention is applied. Next, the crystalline silicon film is patterned by a photolithography method to form semiconductor layers 602 to 606.

After the semiconductor layers 602 to 606 are formed, a small amount of impurity elements (boron or phosphorus) may be added in order to control the threshold of TFTs.

Next, a gate insulating film 607 is formed to cover the semiconductor layers 602 to 606. The gate insulating film 607 is formed with an insulating film containing silicon in thickness from 40 to 150 nm by a plasma CVD method or a sputtering method. In this embodiment, the gate insulating film 607 is formed with a silicon oxynitride film (composition ratio: Si=32%, O=59%, N=7%, H=2%) having a thickness of 110 nm by a plasma CVD method. The gate insulating film may be formed with not only the silicon oxynitride film but also another insulating film containing silicon in a single-layer structure or in a multilayer structure.

When a silicon oxide film is used, the silicon oxide film can be formed by a plasma CVD method with a mixture of TEOS (Tetraethyl Orthosilicate) and $O_2$, at a reaction pressure of 40 Pa, with a substrate temperature set in the range of 300 to 400° C., and by discharging at a high frequency (13.56 MHz) with an electric power density from 0.5 to 0.8 W/cm$^2$. The silicon oxide film thus manufactured obtains a good characteristic as the gate insulating film by the following thermal annealing at 400 to 500° C.

Next, a first conductive film 608 having thickness from 20 to 100 nm and a second conductive film 609 having thickness from 100 to 400 nm are formed in a multilayer structure over the gate insulating film 607 as shown in FIG. 5B. In this embodiment, the first conductive film 608 of 30 nm thick including a TaN film, and the second conductive film 609 of 370 nm thick including a W film are formed in a multilayer structure. The TaN film is formed by a sputtering method using Ta as a target in an atmosphere including nitrogen. The W film is formed by a sputtering method using W as a target. Instead of the sputtering method, the W film can also be formed by a thermal CVD method using tungsten hexafluoride ($WF_6$). In any way, in order to use the W film as a gate electrode, it is necessary to make the W film low resistant, and therefore, it is preferable to make the resistivity of the W film not more than 20μΩcm. The W film can be made low resistant by enlarging its crystal grain; however, when the W film contains a large amount of impurity elements such as oxygen, the crystallization is interrupted, which accordingly increases the resistance. Therefore, in this embodiment, the W film is formed by a sputtering method using high-purity W (purity 99.9999%) as a target, and moreover, very careful attention is paid when forming the W film so that the impurities in the vapor may not penetrate into the W film. Thus, it has become possible to make its resistivity in the range of 9 to 20 μΩcm.

It is to be noted that, in this embodiment, the first conductive film 608 is formed with TaN and the second conductive film 609 is formed with W; however, the material for the conductive films are not limited to these elements. Both of the conductive films may be formed with an element selected from Ta, W, Ti, Mo, Al, Cu, Cr and Nd, or may be formed with a compound material or an alloy material including the above element as its main component. In addition, a semiconductor film, typically a crystalline silicon film doped with an impurity element such as phosphorus may be employed. Moreover, AgPdCu alloy may be used. In addition, these conductive films may have a structure in which the first conductive film is formed with a tantalum (Ta) film and the second conductive film is formed with a W film, a structure in which the first conductive film is formed with a titanium nitride (TiN) film and the second conductive film is formed with a W film, a structure in which the first conductive film is formed with a tantalum nitride (TaN) film and the second conductive film is formed with an Al film, or a structure in which the first conductive film is formed with a tantalum nitride (TaN) film and the second conductive film is formed with a Cu film.

Next, after forming masks 610 to 615 including resist by a photolithography method, a first etching process is performed to form electrodes and wirings. The first etching process is performed in accordance with first and second etching conditions. An ICP (Inductively Coupled Plasma) etching method is employed as the first etching condition in this embodiment. Under the first etching condition, $CF_4$, $Cl_2$ and $O_2$ are used as the etching gas at a gas flow rate 25/25/10 (sccm) respectively, and plasma is generated by applying 500 W RF (13.56 MHz) electric power to a coil shaped electrode at a pressure of 1 Pa. In this process, a dry-etching apparatus using ICP manufactured by Matsushita Electric Industrial Co., Ltd. (Model E645-☐ICP) is used. 150 W RF (13.56 MHz) electric power is also applied to the substrate side (sample stage), thereby applying substantially a negative self-bias voltage. The W film is etched under the first etching condition, and the edge portion of the first conductive layer is made into a tapered shape.

Next, the etching process is performed for about 30 seconds under the second etching condition without removing the masks 610 to 615 including resist. Under the second etching condition, $CF_4$ and $Cl_2$ are used as the etching gas at a gas flow rate 30/30 (sccm) and plasma is generated by applying 500 W RF (13.56 MHz) to a coil shaped electrode at a pressure of 1 Pa. An electric power at 20 W RF (13.56 MHz) is also applied to the substrate side (sample stage), thereby applying substantially a negative self-bias voltage. Under the second etching condition using the mixed gas of $CF_4$ and $Cl_2$, the W film and the TaN film are both etched to the same extent. It is noted that in order to perform the etching process without leaving a residue on the gate insulating film, the time for etching is increased for approximately 10 to 20%.

In the first etching process described above, the end portions of the first and second conductive layers are tapered due to the effect of the bias voltage applied to the substrate side by optimizing the shapes of the masks including resist. The tapered portion has an angle in the range of 15° to 45°. Thus, first shaped conductive layers 617 to 622 including the first conductive layers and the second conductive layers (first conductive layers 617a to 622a and second conductive layers 617b to 622b) are formed. A reference numeral 616 denotes a gate insulating film. A region not covered with the first shaped conductive layers 617 to 622 is etched for approximately 20 to 50 nm.

Figure 6A:
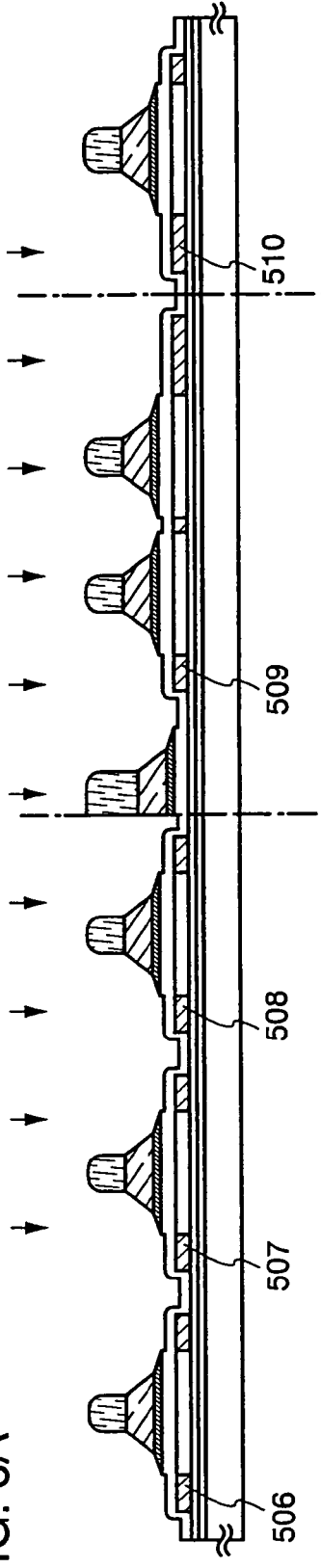
FIGS. 6A to 6C are cross-sectional views showing steps of manufacturing a pixel TFT and a driver circuit.

Then, a first doping process is performed without removing the masks including resist so that the semiconductor layers are doped with an impurity element imparting n-type conductivity (FIG. 6A). The first doping process may be performed by an ion doping method or an ion implantation method. The ion doping method is performed under a condition in which the dosage ranges from $1 \times 10^{13}$ to $5 \times 10^{15}/cm^2$ and the acceleration voltage ranges from 60 to 100 keV. In this embodiment, the dosage is $1.5 \times 10^{15}/cm^2$ and the acceleration voltage is 80 keV. A 15th element in the periodic table, typically phosphorus (P) or arsenic (As), is used as an impurity element imparting n-type conductivity. Phosphorus (P) is used in this embodiment. In such a case, first high-concentration impurity regions 506 to 510 are formed in a self-aligning manner by using the conductive layers 617 to 621 as the masks against the impurity element imparting n-type conductivity. The first high-concentration impurity regions 506 to 510 are doped with the impurity element imparting n-type conductivity at a concentration of $1 \times 10^{20}$ to $1 \times 10^{21}/cm^3$.

Next, a second etching process is performed without removing the masks including resist. The second etching process is performed using $CF_4$, $Cl_2$, and $O_2$ as the etching gas to etch the W film selectively. Through the second etching process, second conductive layers 628b to 633b are formed. On the other hand, the first conductive layers 617a to 622a are hardly etched, and second shaped conductive layers 628 to 633 are formed.

Figure 6B:
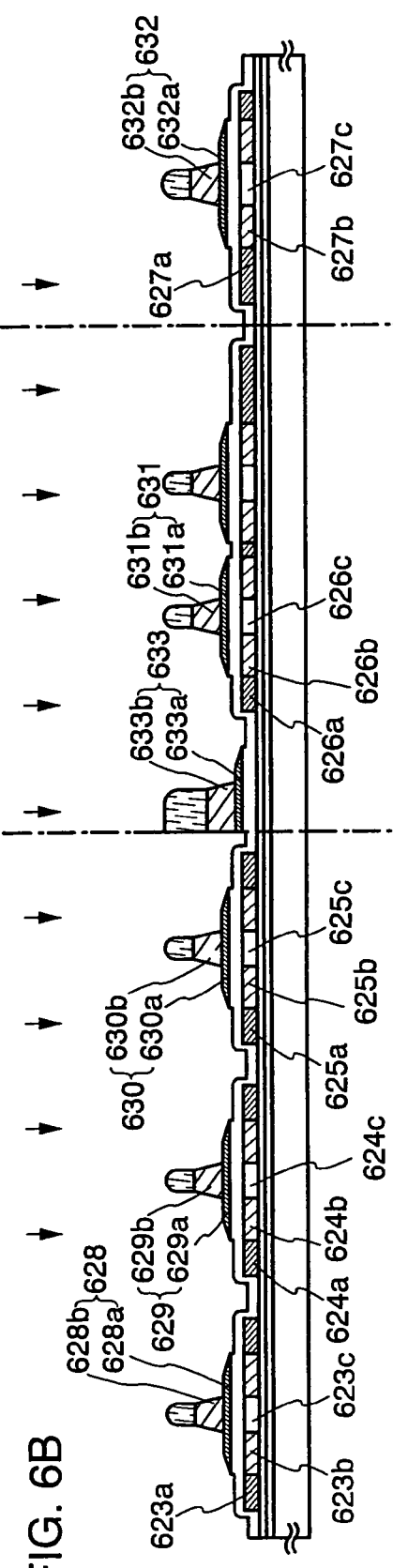

Next, a second doping process is performed as shown in FIG. 6B without removing the masks including resist. In this case, the dosage is set lower than that in the first doping process and the impurity element imparting n-type conductivity is introduced at a high accelerating voltage ranging from 70 to 120 keV. In this embodiment, the dosage is $1.5 \times 10^{14}/cm^2$ and the acceleration voltage is 90 keV. The second shaped conductive layers 628 to 633 are used as masks and the second doping process is performed so that the impurity element is also introduced in the semiconductor layer provided below the second conductive layers 628b to 633b. Thus, second high-concentration impurity regions 623a to 627a and low-concentration impurity regions 623b to 627b are newly formed.

Figure 6C:
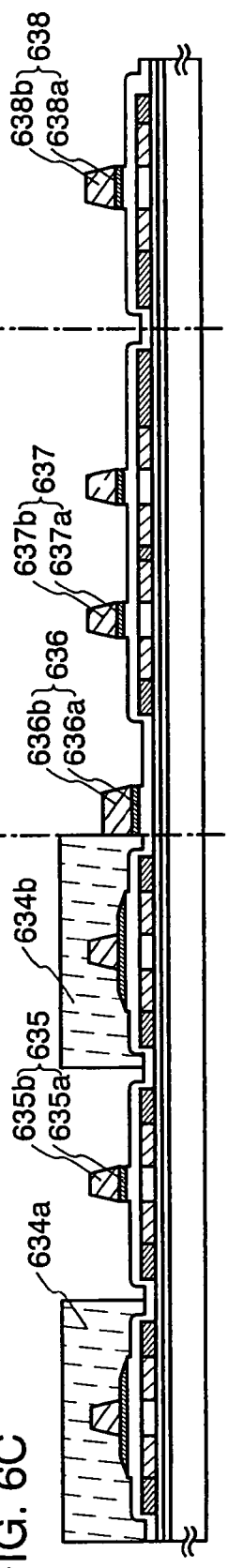

Next, after removing the mask including resist, new masks 634a and 634b including resist are formed, and a third etching process is performed as shown in FIG. 6C. $SF_6$ and $Cl_2$ are used as the etching gas at a gas flow rate 50/10 (sccm) and plasma is generated by applying 500 W RF (13.56 MHz) electric power to a coil shaped electrode at a pressure of 1.3 Pa. The etching process is performed for about 30 seconds. An electric power at 10 W RF (13.56 MHz) is also applied to the substrate side (sample stage), thereby applying substantially a negative self-bias voltage. Through the third etching process, the TaN film of a p-channel TFT and a TFT in a pixel portion (a pixel TFT) is etched to form third shaped conductive layers 635 to 638.

Next, after removing the mask including resist, the second shaped conductive layers 628 and 630 and the third shaped conductive layers 635 to 638 are used as the masks to remove the gate insulating film 616 selectively, thereby forming insulating layers 639 to 644 (FIG. 7A).

Next, after forming new masks 645a to 645c including resist, a third doping process is performed. Through the third doping process, impurity regions 646 and 647 are formed by adding an impurity element imparting a conductivity type opposite to the former conductivity type into the semiconductor layer that will be an active layer of the p-channel TFT. The first conductive layers 635a and 638a are used as the masks against the impurity element and the impurity element imparting p-type conductivity is added to form the impurity region in a self-aligning manner. In this embodiment, the impurity regions 646 and 647 are formed by an ion doping method using diborane ($B_2H_6$). (FIG. 7B) Through the third doping process, the semiconductor layers forming n-channel TFTs are covered with the mask 645a to 645c including resist. Although phosphorus has been added to the impurity regions 646 and 647 at a different concentration respectively through the first and the second doping processes, the doping processes are performed so that the concentration of the impurity element imparting p-type conductivity ranges from $2 \times 10^{20}$ to $2 \times 10^{21}/cm^3$ in both regions, and therefore, these regions serve as the source region and the drain region of the p-channel TFT without any problems. Since a part of the semiconductor layer that will be the active layer of the p-channel TFT is exposed, this embodiment provides an advantage in that the impurity element (boron) is easily added.

The impurity region is formed in each semiconductor layer according to the above steps.

Next, the masks 645a to 645c including resist are removed and a first interlayer insulating film 661 is formed. The first interlayer insulating film 661 is formed with an insulating film containing silicon in thickness from 100 to 200 nm by a plasma CVD method or a sputtering method. In this embodiment, a silicon oxynitride film is formed 150 nm in thickness by a plasma CVD method. Not only the silicon oxynitride film but also another insulating film containing silicon may be used as the first interlayer insulating film 661 in a single-layer structure or in a multilayer structure.

Next, a heating process is performed to recover the crystallinity of the semiconductor layer and to activate the impurity element added in the respective semiconductor layers as shown in FIG. 7C. This heating process is performed by a thermal annealing method using an annealing furnace. The thermal annealing method may be performed in an atmosphere of nitrogen with an oxygen concentration of 1 ppm or less, preferably 0.1 ppm or less at 400 to 700° C., typically from 500 to 550° C. In this embodiment, the activation process is performed at 550° C. for four hours. Not only the thermal annealing method but also a laser annealing method and a rapid thermal annealing method (RTA method) can be employed. As for the laser annealing method, the method shown in Embodiment Mode is preferably employed.

In addition, the heating process may be performed before forming the first interlayer insulating film. However, when the material for the wirings does not have enough resistance against heat, it is preferable to form the interlayer insulating film (such as an insulating film containing silicon as its main component, for example a silicon nitride film) in order to protect the wirings and the like before the activating process as shown in this embodiment.

Furthermore, a heating process is performed in an atmosphere including hydrogen for 3 to 100% at 300 to 550° C. for 1 to 12 hours in order to hydrogenate the semiconductor layers. In this embodiment, the heating process is performed in an atmosphere of nitrogen including hydrogen for about 3% at 410° C. for one hour. This process is to terminate dangling bonds in the semiconductor layers with hydrogen included in the interlayer insulating film. As another means for the hydrogenation, plasma hydrogenation (using hydrogen excited by plasma) may be performed.

When the laser annealing method is employed for the activation process, it is preferable to deliver the laser beam emitted from an excimer laser, a YAG laser, or the like after the above hydrogenation.

Next, a second interlayer insulating film 662 including an inorganic insulating material or an organic insulating material is formed over the first interlayer insulating film 661. In this embodiment, the second interlayer insulating film 662 is formed with an acrylic resin film having a thickness of 1.6 μm. After forming the second interlayer insulating film 662, a third interlayer insulating film 672 is formed in contact with the second interlayer insulating film 662.

In a driver circuit 706, wirings 663 to 667 connecting electrically to the respective impurity regions are formed. It is to be noted that these wirings are formed by patterning a multilayer film including a 50-nm-thick Ti film and a 500-nm-thick alloy film (alloy film of Al and Ti). Not only the two-layer structure but also a single-layer structure or a multilayer structure including three or more layers is also applicable. Moreover, the material for the wiring is not limited to Al and Ti. For example, the wiring may be formed by patterning a multilayer film in which Al or Cu is formed on the TaN film and another Ti film is further formed thereon.

Figure 8:
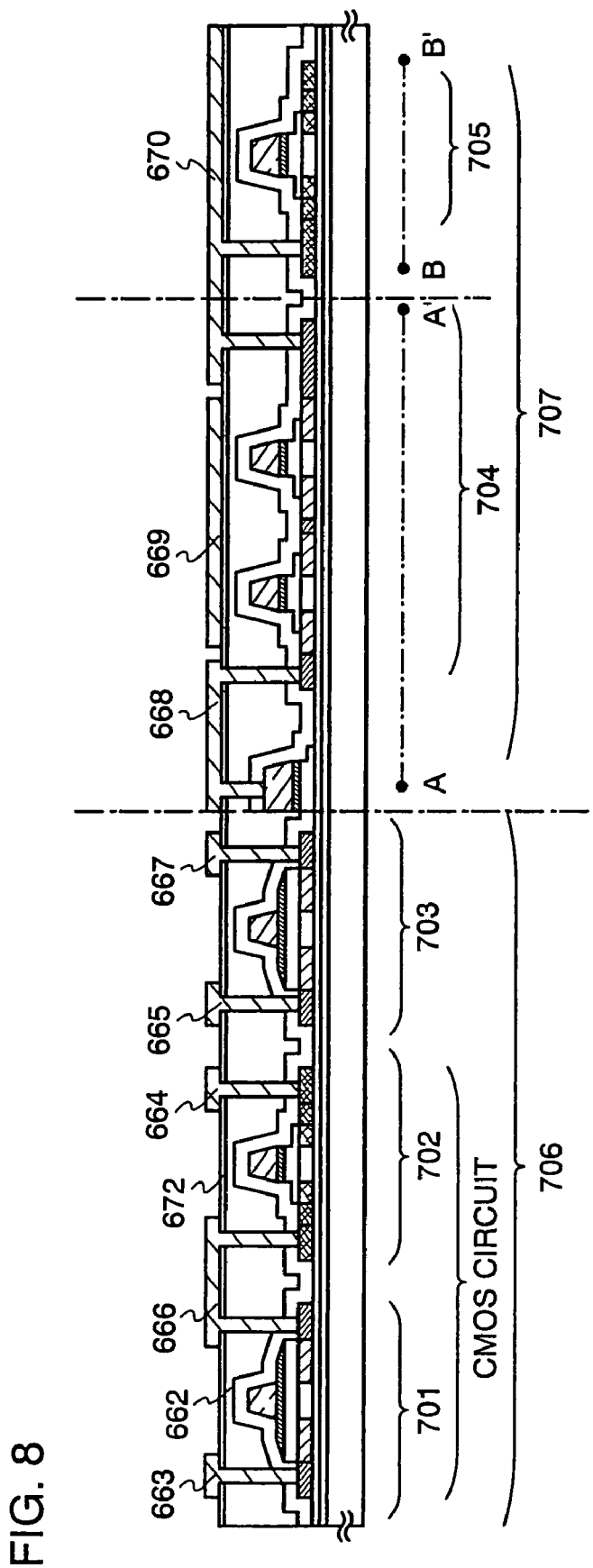
FIG. 8 is a cross-sectional view showing a step of manufacturing a pixel TFT and a driver circuit.

In a pixel portion 707, a pixel electrode 670, a gate wiring 669, and a connection electrode 668 are formed (FIG. 8). The connection electrode 668 forms electrical connection between the source wiring (the multilayer of 636a and 636b) and the pixel TFT. In addition, the gate wiring 669 and the gate electrode of the pixel TFT are electrically connected. Moreover, the pixel electrode 670 is electrically connected with the drain region of the pixel TFT and is further connected electrically with a semiconductor layer 658 serving as one electrode for forming a holding capacitor. In addition, it is preferable to form the pixel electrode 670 with a material having high reflectivity such as a film including Al or Ag as its main component or a multilayer film including those.

According to these steps, a driver circuit 706 having an n-channel TFT 703 and a CMOS circuit which includes an n-channel TFT 701 and a p-channel TFT 702, and a pixel portion 707 having a pixel TFT 704 and a holding capacitor 705 can be formed on one substrate. Thus, an active matrix substrate is completed.

The n-channel TFT 701 included in the driver circuit 706 has a channel-forming region 623c, a low-concentration impurity region 623b (GOLD region) overlapping the first conductive layer 628a constituting a part of the gate electrode, and a high-concentration impurity region 623a serving as a source region or a drain region. The p-channel TFT 702 forming a CMOS circuit by connecting the n-channel TFT 701 with a wiring 666 has a channel-forming region 646d, impurity regions 646b and 646c formed outside the gate electrode, and a high-concentration impurity region 646a serving as a source region or a drain region. Moreover, the n-channel TFT 703 has a channel-forming region 625c, a low-concentration impurity region 625b (GOLD region) overlapping the first conductive layer 630a constituting a part of the gate electrode, and a high-concentration impurity region 625a serving as a source region or a drain region.

The pixel TFT 704 in the pixel portion has a channel-forming region 626c, a low-concentration impurity region 626b (LDD region) formed outside the gate electrode, and a high-concentration impurity region 626a serving as a source region or a drain region. The semiconductor layers 647a and 647b serving as one electrode of the holding capacitor 705 are doped with the impurity element imparting p-type conductivity respectively. The holding capacitor 705 is formed with the electrode (the multilayer of 638a with 638b) and the semiconductor layers 647a to 647d, using the insulating layer 644 as its dielectric.

In addition, in this embodiment, the pixel is formed in such a way that the space between the pixel electrodes is shielded from light without forming black matrix by having the end portions of the pixel electrodes overlap the source wirings.

Figure 9:
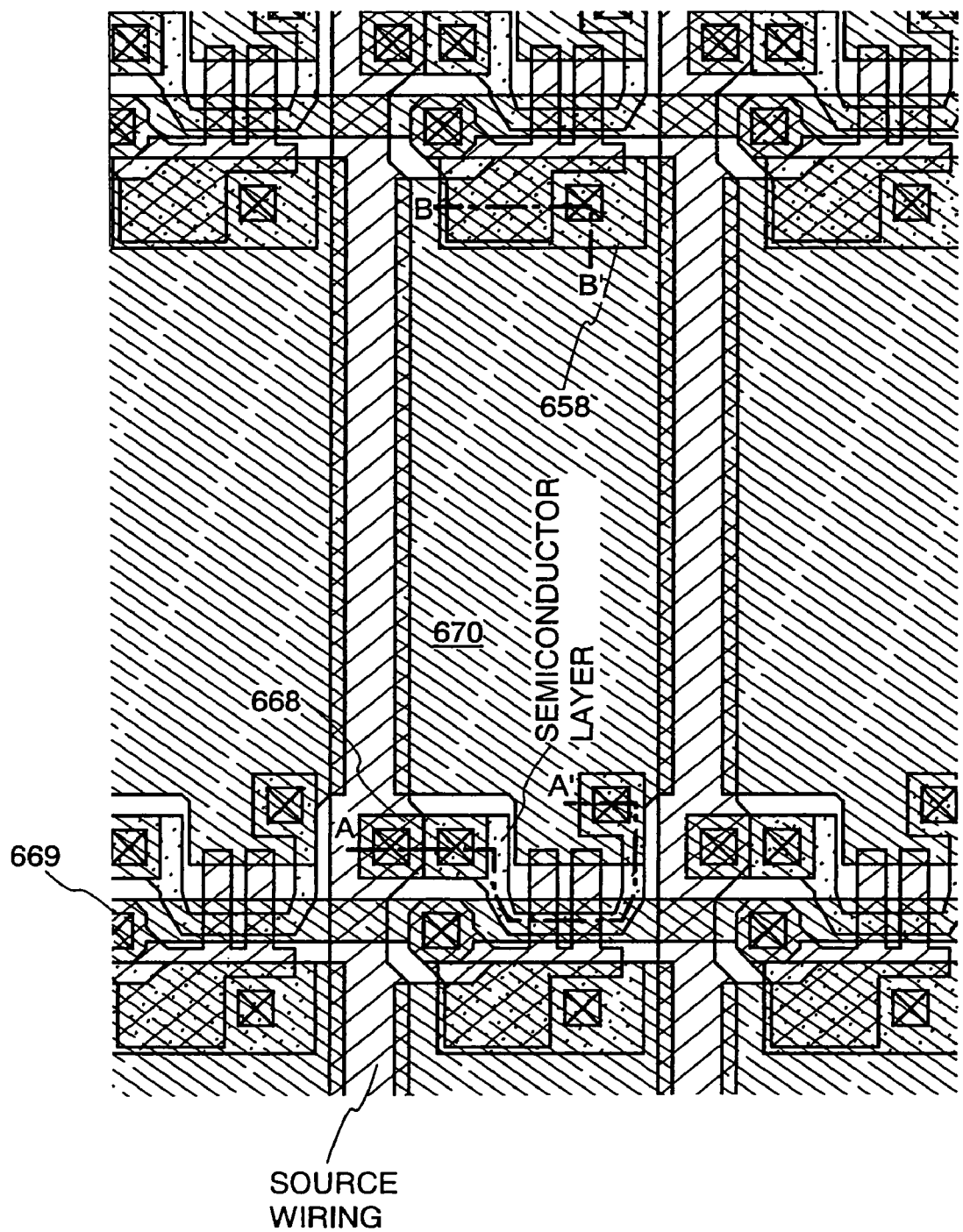
FIG. 9 is a cross-sectional view showing a structure of a pixel TFT.

In addition, FIG. 9 is a top view of the pixel portion in the active matrix substrate manufactured in this embodiment. It is noted that the same reference numeral is used to the same part as that in FIGS. 5A to 8. A chain line A-A' in FIG. 8 corresponds to a sectional view taken along a chain line A-A' in FIG. 9. Moreover, a chain line B-B' in FIG. 8 corresponds to a sectional view taken along a chain line B-B' in FIG. 9.

This embodiment can be freely combined with Embodiment 1 or 2.

Embodiment 4

Figure 10:
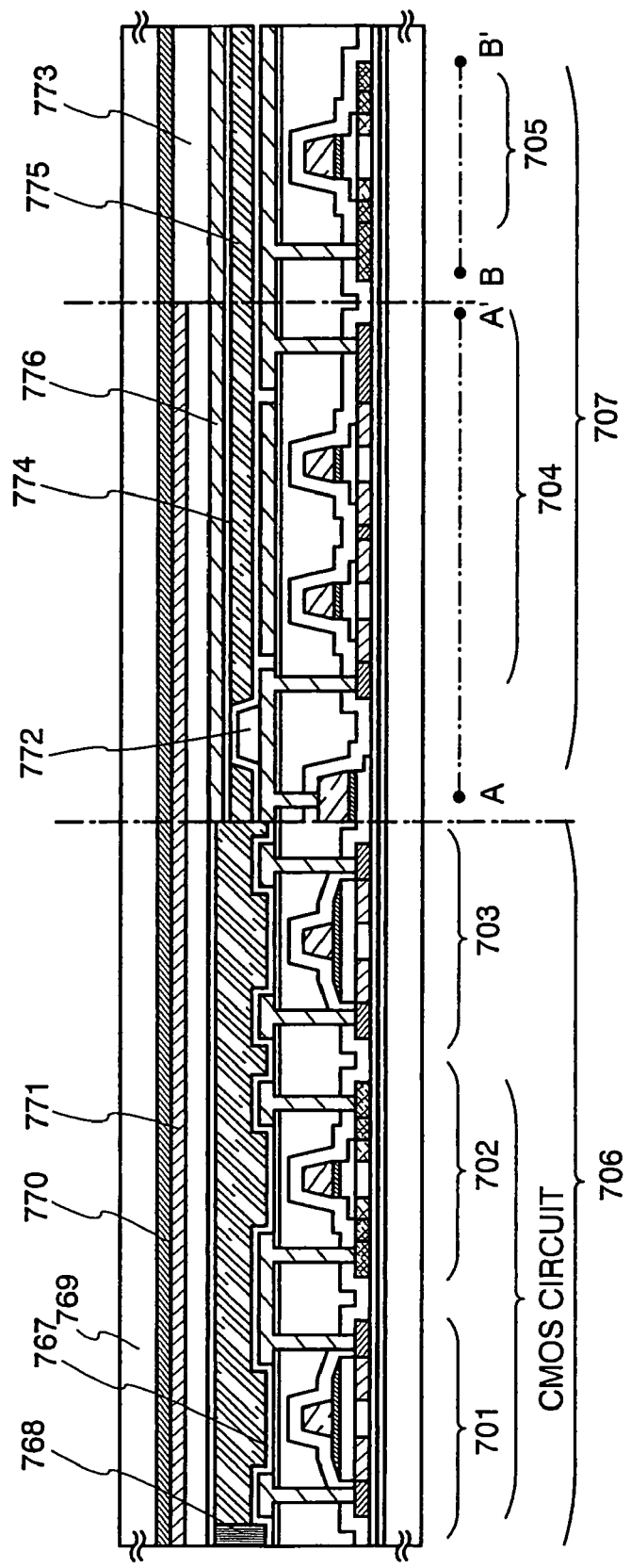
FIG. 10 is a cross-sectional view showing a step of manufacturing an active matrix liquid crystal display device.

With reference to FIG. 10, this embodiment describes steps of manufacturing a reflective liquid crystal display device using the active matrix substrate manufactured in Embodiment 3.

First of all, the active matrix substrate in a state shown in FIG. 8 is prepared in accordance with Embodiment 3. Then, an orientation film 767 is formed over the active matrix substrate in FIG. 8, at least on the pixel electrode 670, and a rubbing process is performed thereto. It is to be noted that before forming the orientation film 767, a pillar spacer 772 is formed at the desired position in order to keep space between the substrates by patterning an organic resin film such as an acrylic resin film in this embodiment. A spherical spacer may be dispersed all over the substrate instead of the pillar spacer.

Next, an opposing substrate 769 is prepared. Then, colored layers 770 and 771 and a planarization film 773 are formed over the opposing substrate 769. The red colored layer 770 and the blue colored layer 771 are overlapped to form a light-shielding portion. Alternatively, the red colored layer and the green colored layer may be overlapped partially to form the light-shielding portion.

In this embodiment, the substrate shown in Embodiment 3 is used. Therefore, in FIG. 9 showing the top view of the pixel portion in Embodiment 3, it is necessary to shield at least the following spaces from light; a space between the gate wiring 669 and the pixel electrode 670, a space between the gate wiring 669 and the connection electrode 668, and a space between the connection electrode 668 and the pixel electrode 670. In this embodiment, each colored layer is arranged so that the light-shielding portions including the stacked colored layers are overlapped at the position which should be shielded from light, and the opposing substrate is then pasted.

Thus, it becomes possible to reduce the number of steps by shielding the spaces between the pixels from light with the light-shielding portion including the colored layers without forming a light-shielding layer such as a black mask.

Next, an opposing electrode 776 including a transparent conductive film is formed over the planarization film 773, at least in the pixel portion, and then an orientation film 774 is formed all over the surface of the opposing substrate and a rubbing process is conducted.

The active matrix substrate with the pixel portions and the driver circuits formed therein is pasted to the opposing substrate using a sealing material 768. Filler is contained in the sealing material 768 and the two substrates are pasted while keeping a uniform space by this filler and the pillar spacer. After that, a liquid crystal material 775 is injected between the substrates and the two substrates are sealed with sealant (not shown) completely. A known liquid crystal material may be employed for the liquid crystal material 775. Thus, the reflective liquid crystal display device is completed. If necessary, the active matrix substrate or the opposing substrate is cut into a desired shape. Moreover, a polarizing plate (not shown) is pasted only to the opposing substrate. An FPC (flexible print circuit) is then pasted with a known technique.

The liquid crystal display device thus manufactured can be employed for the display portions in various kinds of electronic appliances.

This embodiment can be freely combined with any one of Embodiments 1 to 3.

Embodiment 5

This embodiment describes an example in which the present invention is applied to manufacture a light-emitting device. In this specification, the light-emitting device is a generic term for a display panel where a light-emitting element formed over a substrate is sealed between the substrate and a cover material, and for a display module having the display panel equipped with an IC. It is to be noted that the light-emitting element has a layer containing an organic compound giving electroluminescence by applying an electric field (light-emitting layer), an anode layer, and a cathode layer. The luminescence in the organic compound includes one or both of the luminescence (fluorescence) when the singlet-excited state returns to the ground state, and the luminescence (phosphorescence) when the triplet-excited state returns to the ground state.

Figure 11:
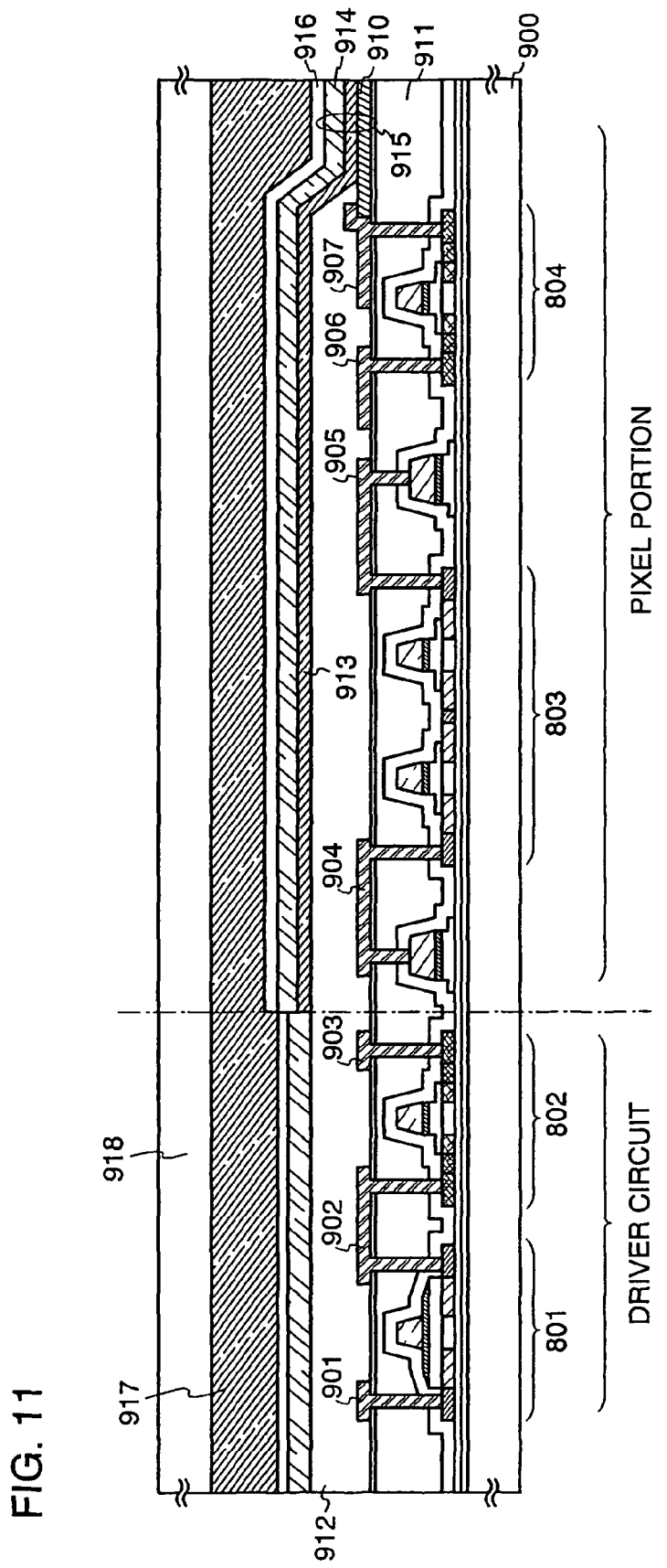
FIG. 11 is a cross-sectional structural view of a driver circuit and a pixel portion of a light-emitting device.

FIG. 11 is a cross-sectional view of the light-emitting device in this embodiment. In FIG. 11, a switching TFT 803 provided over a substrate 900 is formed with the n-channel TFT 703 in FIG. 8. Therefore, concerning the structure, the description of the n-channel TFT 703 may be referred to.

It is to be noted that this embodiment describes a double-gate structure with two channel-forming regions; however, a single-gate structure with one channel-forming region or a triple-gate structure with three channel-forming regions may also be employed.

The driver circuit provided over the substrate 900 is formed with the CMOS circuit in FIG. 8. Therefore, concerning the structure, the description of the n-channel TFT 701 and the p-channel TFT 702 may be referred to. Although this embodiment describes a single-gate structure, a double-gate structure or a triple-gate structure may also be employed.

Wirings 901 and 903 serve as source wirings of the CMOS circuit, and a wiring 902 serves as a drain wiring of the CMOS circuit. In addition, a wiring 904 serves as a wiring that electrically connects the source wiring and the source region of the switching TFT. A wiring 905 serves as a wiring that electrically connects the drain wiring and the drain region of the switching TFT.

It is to be noted that a current controlling TFT 804 is formed with the p-channel TFT 702 in FIG. 8. Therefore, concerning the structure, the description of the p-channel TFT 702 may be referred to. Although this embodiment employs the single-gate structure, a double-gate structure or a triple-gate structure is also applicable.

A wiring 906 is a source wiring of the current controlling TFT (corresponding to a wiring for supplying current) and a wiring 907 is an electrode connecting electrically with a pixel electrode 910 of the current controlling TFT by being overlapped on the pixel electrode 910.

It is noted that a reference numeral 910 denotes a pixel electrode (an anode of the light-emitting element) including the transparent conductive film. The transparent conductive film can be formed with a compound of indium oxide and tin oxide, a compound of indium oxide and zinc oxide, zinc oxide, tin oxide, or indium oxide. Moreover, the transparent conductive film doped with gallium may also be employed. The pixel electrode 910 is formed over a flat interlayer insulating film 911 before forming those wirings. In this embodiment, it is very important to planarize the steps due to the TFTs with the planarizing film (the interlayer insulating film 911) including resin. The light-emitting layer formed later is so thin that the faulty luminance might occur due to the steps. Therefore, it is preferable to planarize before forming the pixel electrode so that the light-emitting layer is formed on the plane as flat as possible.

After forming the wirings 901 to 907, a bank 912 is formed as shown in FIG. 11. The bank 912 may be formed by patterning an insulating film containing silicon or an organic resin film, each having thickness from 100 to 400 nm.

It is to be noted that attention must be paid for the element when the bank 912 is formed so that the element may not be damaged due to static electricity because the bank 912 is an insulating film. In this embodiment, the resistivity is lowered by adding a carbon particle or a metal particle in the insulating film, which is a material for the bank 912, so as to prevent the static electricity. In such a case, the amount of the carbon particles or the metal particles is adjusted so that the resistivity ranges from $1 \times 10^6$ to $1 \times 10^{12}$ $\Omega$m (preferably from $1 \times 10^8$ to $1 \times 10^{10}$ $\Omega$m).

A light-emitting layer 913 is formed over the pixel electrode 910. Although FIG. 11 shows only one pixel, the light-emitting layers are made in parts corresponding to each color of R (red), G (green) and B (blue) in this embodiment. In addition, in this embodiment, a low-molecular weight organic light-emitting element is formed by an evaporation method. Specifically, a multilayer structure is employed in which a copper phthalocyanine (CuPc) film of 20 nm thick is formed as a hole-injecting layer, and a tris-8-quinolinolato aluminum complex ($Alq_3$) film of 70 nm thick is formed thereover as the light-emitting layer. Adding the pigment such as quinacridone, perylene, DCM1, or the like to $Alq_3$ can control the emission color.

However, the organic light-emitting material available as the light-emitting layer is not limited at all to those described above. The light-emitting layer, a charge-transporting layer, and a charge-injecting layer may be freely combined to form the light-emitting layer (the layer for light emission and for moving the carrier for the light emission). For instance, although this embodiment shows an example in which the low-molecular weight organic light-emitting material is employed for the light-emitting layer, a high-molecular weight organic light-emitting material may also be employed. In addition, an inorganic material such as silicon carbide can also be used as the charge-transporting layer and the charge-injecting layer. These organic light-emitting material and inorganic material may be known materials.

Next, a cathode 914 including the conductive film is provided over the light-emitting layer 913. In this embodiment, an alloy film of aluminum and lithium is used as the conductive film. Moreover, a known MgAg film (an alloy film of magnesium and silver) can also be used. A conductive film formed with an element belonging to a 1st or 2nd group in the periodic table or a conductive film doped with such an element can be used as the cathode material.

When the steps are performed up to forming the cathode 914, a light-emitting element 915 is completed. It is to be noted that the light-emitting element 915 described here indicates a diode formed with the pixel electrode (anode) 910, the light-emitting layer 913, and the cathode 914.

It is effective to provide a passivation film 916 so as to cover the light-emitting element 915 completely. The passivation film 916 is formed with an insulating film including a carbon film, a silicon nitride film, or a silicon nitride oxide film in a single-layer structure or in a multilayer structure.

Here, the passivation film is preferably formed with a film whose coverage is good, and it is effective to employ a carbon film, especially a DLC (diamond-like carbon) film. Since the DLC film can be formed at temperatures ranging from the room temperature to 100° C., the DLC film can be easily formed over the light-emitting layer 913 having low resistance against heat. Moreover, the DLC film has a high blocking effect against oxygen, and therefore, it is possible to suppress oxidization of the light-emitting layer 913. Therefore, the DLC film can prevent the light-emitting layer 913 from being oxidized during the following sealing step.

Moreover, sealant 917 is provided over the passivation film 916 to paste a cover material 918. UV curable resin may be used as the sealant 917 and it is effective to provide an absorbent material or an antioxidant material inside. In addition, in this embodiment, the cover material 918 is a glass substrate, a quartz substrate, or a plastic substrate (including a plastic film), each having carbon films (preferably DLC films) formed on opposite sides of the substrate.

Thus, the light-emitting device having the structure shown in FIG. 11 is completed. It is effective to perform continuously all the steps after forming the bank 912 up to forming the passivation film 916 in a film-forming apparatus of a multi-chamber type (or an in-line type) without releasing the device to the air. Furthermore, it is possible to conduct the steps up to pasting the cover material 918 continuously without releasing the device to the air.

Thus, an n-channel TFT 801, a p-channel TFT 802, the switching TFT (n-channel TFT) 803, and the current controlling TFT (p-channel TFT) 804 are formed over an insulator (substrate 900) using a plastic substrate as a base material. The number of masks needed in these manufacturing steps is less than that needed in manufacturing steps of a general active matrix light-emitting device.

That is to say, the step of manufacturing a TFT is simplified to a large degree, thereby boosting the yield and lowering the production cost.

In addition, as described with FIG. 11, the provision of the impurity region overlapping the gate electrode through the insulating film can form the n-channel TFT that has enough resistance against deterioration due to a hot-carrier effect. Therefore, a light-emitting device with high reliability can be obtained.

Although this embodiment shows only the structures of the pixel portion and the driver circuit, another logical circuit such as a signal divider circuit, a D/A converter, an operational amplifier, a γ correction circuit, and the like can be further formed on the same insulator according to the manufacturing steps in this embodiment. Moreover, a memory and a microprocessor can be further formed.

Furthermore, the light-emitting device in this embodiment in which the step up to sealing (or enclosing) in order to protect the light-emitting element has been performed is described with reference to FIGS. 12A and 12B. The reference numeral used in FIG. 11 is referred to as necessary.

Figure 12A:
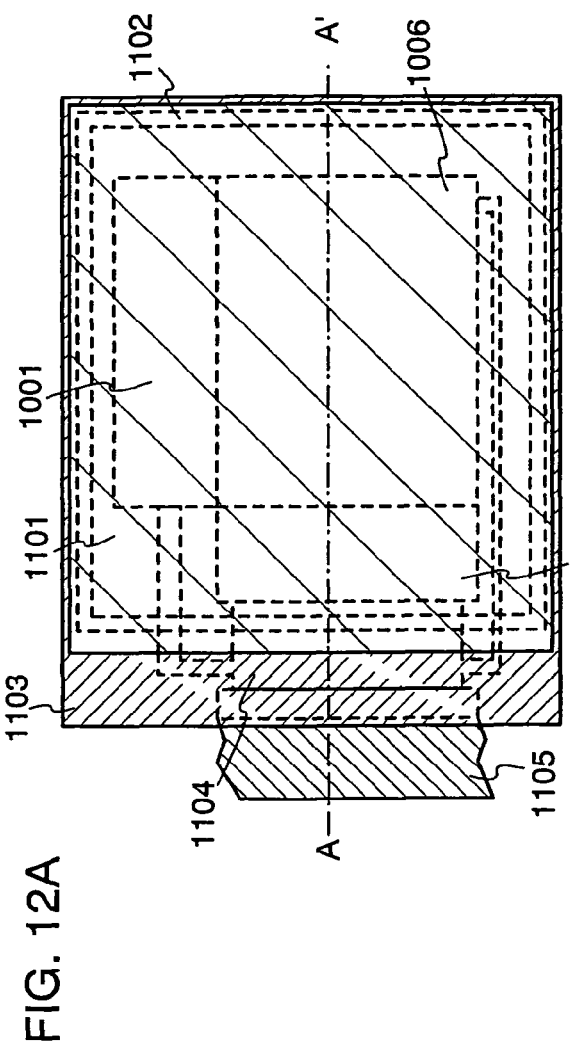
FIG. 12A is a top view of a light-emitting device and FIG. 12B is a cross-sectional structural view of a driver circuit and a pixel portion of a light-emitting device.
Figure 12B:
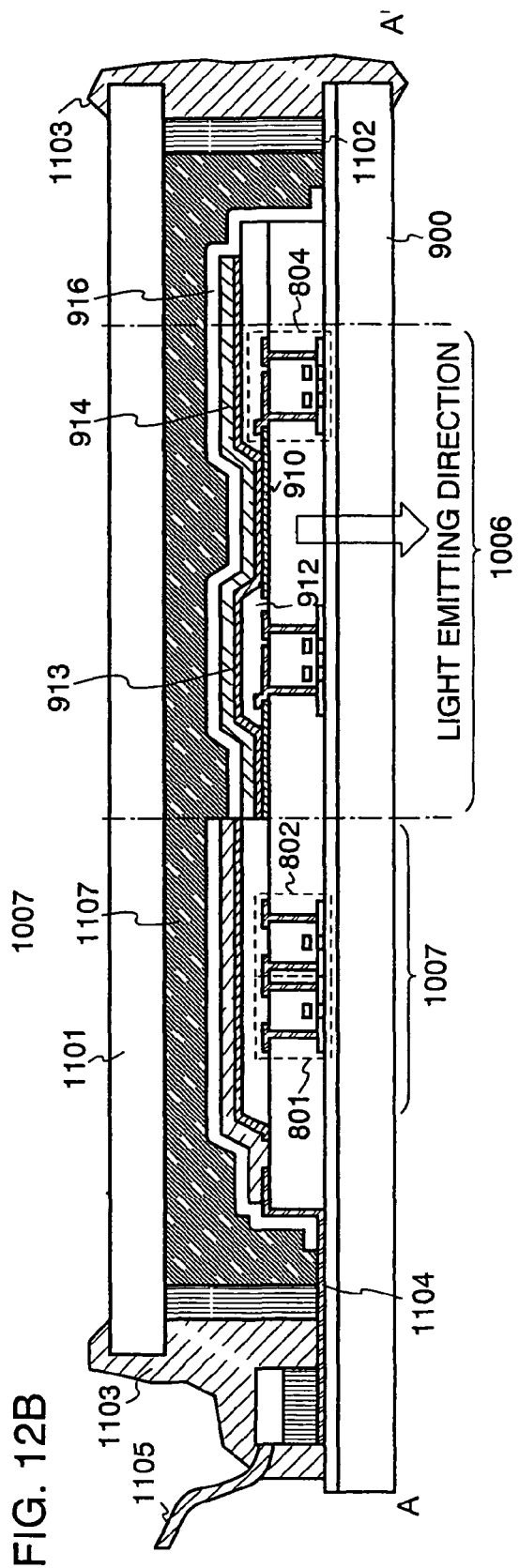

FIG. 12A is a top view to show an aspect in which the step up to sealing the light-emitting element has been performed. FIG. 12B is a cross-sectional view taken along A-A' in FIG. 12A. A reference numeral 1001 drawn with a dotted line denotes a source side driver circuit; 1006, a pixel portion; 1007, a gate side driver circuit; 1101, a cover material; 1102, a first sealing material; 1103, a second sealing material; and 1107, sealant provided in the space surrounded by the first sealing material 1102.

It is noted that a reference numeral 1104 denotes a wiring to transmit a signal to be inputted into the source side driver circuit 1001 and the gate side driver circuit 1007 and to receive a video signal or a clock signal from an FPC (Flexible Printed Circuit) 1105 to be an external input terminal. In addition, although only the FPC is shown here, this FPC may be equipped with a printed wiring board (PWB). The light-emitting device in this specification includes not only the light-emitting device itself but also the light-emitting device equipped with the FPC or the PWB.

Next, the cross-sectional structure is described with reference to FIG. 12B. The pixel portion 1006 and the gate side driver circuit 1007 are formed over the substrate 900. The pixel portion 1006 is formed with a plurality of pixels including the current controlling TFT 804 and the pixel electrode 910 connected electrically with the drain of the current controlling TFT 804. In addition, the gate side driver circuit 1007 is formed with the CMOS circuit (refer to FIG. 8) in which the n-channel TFT 801 and the p-channel TFT 1802 are combined.

The pixel electrode 910 serves as the anode of the light-emitting element. In addition, the bank 912 is formed at opposite ends of the pixel electrode 910, and the light-emitting layer 913 and the cathode 914 of the light-emitting element are formed over the pixel electrode 910.

The cathode 914 also serves as the wiring common to all the pixels and is electrically connected to the FPC 1105 through the connection wiring 1104. Further, all the elements included in the pixel portion 1006 and the gate side driver circuit 1007 are covered with the cathode 914 and the passivation film 916.

Moreover, the cover material 1101 is pasted by the first sealing material 1102. It is to be noted that a spacer including a resin film may be provided in order to keep the space between the cover material 1101 and the light-emitting element. The sealant 1107 fills the inside of the first sealing material 1102. It is preferable to employ epoxy resin as the first sealing material 1102 and the sealant 1107. In addition, it is desirable to employ the material which hardly transmits moisture and oxygen for the first sealing material 1102. Moreover, an absorbent material or an antioxidant material may be included inside the sealant 1107.

The sealant 1107 provided so as to cover the light-emitting element also serves as an adhesive agent in order to adhere the cover material 1101. In addition, FRP (Fiberglass-Reinforced Plastics), PVF (polyvinyl fluoride), mylar, polyester, or acrylic can be employed as the material for a plastic substrate constituting a part of the cover material 1101 in this embodiment.

After adhering the cover material 1101 with the use of the sealant 1107, the second sealing material 1103 is provided so as to cover the side surface (the exposed surface) of the sealant 1107. The second sealing material 1103 can be formed with the same material as that of the first sealing material 1102.

Enclosing the light-emitting element into the sealant 1107 with the above structure makes it possible to shield the light-emitting element from outside completely, and accordingly the material promoting deterioration due to oxidization of the light-emitting layer such as moisture and oxygen can be prevented from penetrating from outside. Therefore, a light-emitting device with high reliability can be obtained.

Embodiment 6

This embodiment describes examples of electronic appliances with the liquid crystal display device or the light-emitting device shown in Embodiment 4 or 5 mounted. As the electronic appliances, a camera such as a video camera or a digital camera, a goggle type display (head mount display), a navigation system, a sound reproduction device (such as a car audio component), a laptop personal computer, a game machine, a mobile information terminal (such as a mobile computer, a cellular phone, a mobile game machine, or an electronic book), an image reproduction device equipped with a recording medium (specifically, a device which reproduces a recording medium such as a digital versatile disk (DVD) and is equipped with a display for displaying the image), and the like are given. FIGS. 13A to 13E show the specific examples of these electronic appliances.

Figure 13A:
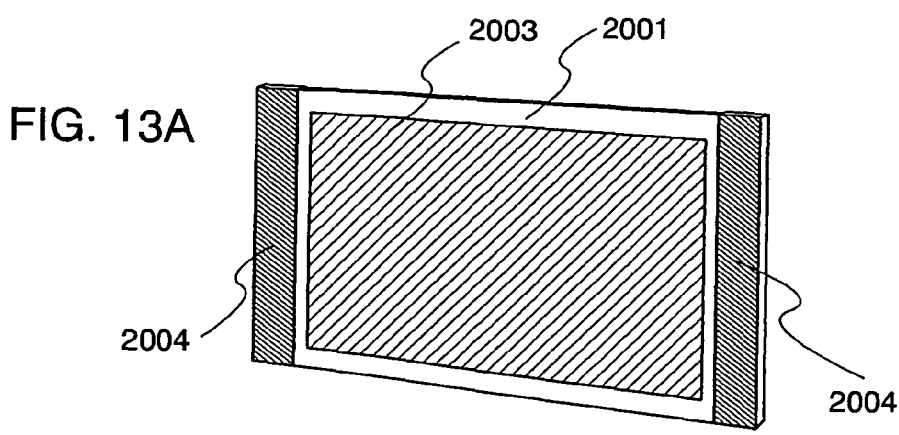
FIGS. 13A to 13E show examples of electronic appliances.

FIG. 13A shows a light-emitting display device which corresponds to, for example, a television receiving device. The light-emitting display device includes a case 2001, a display portion 2003, speaker portions 2004, and the like. In the light-emitting display device according to the present invention, the operating characteristic of a TFT in the display portion 2003 can be enhanced.

Figure 13B:
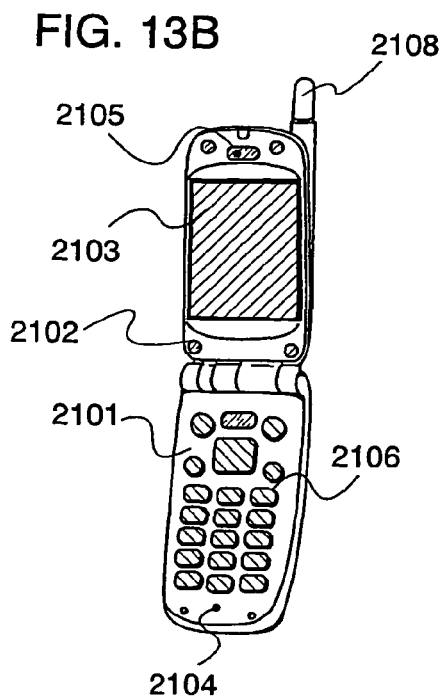

FIG. 13B shows a cellular phone, including a main body 2101, a case 2102, a display portion 2103, an audio input portion 2104, an audio output portion 2105, operation keys 2106, an antenna 2108, and the like. In the cellular phone according to the present invention, the operating characteristic of a TFT in the display portion 2103 can be enhanced.

Figure 13C:
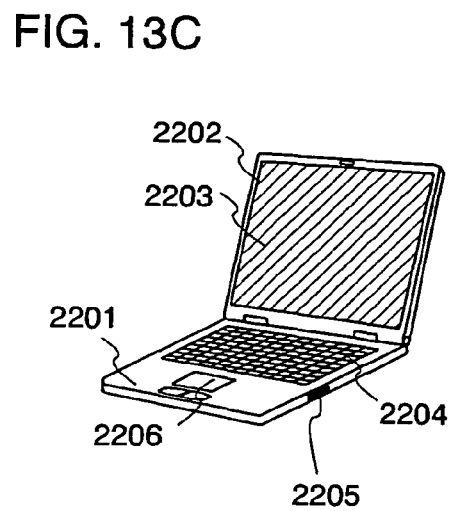

FIG. 13C shows a laptop personal computer including a main body 2201, a case 2202, a display portion 2203, a keyboard 2204, an external connection port 2205, a pointing mouse 2206, and the like. In the laptop personal computer according to the present invention, the operating characteristic of a TFT in the display portion 2203 can be enhanced.

Figure 13D:
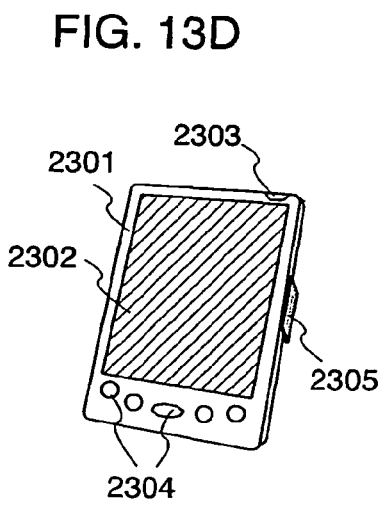

FIG. 13D shows a mobile computer including a main body 2301, a display portion 2302, a switch 2303, operation keys 2304, an infrared ray port 2305, and the like. In the mobile computer according to the present invention, the operating characteristic of a TFT in the display portion 2302 can be enhanced.

Figure 13E:
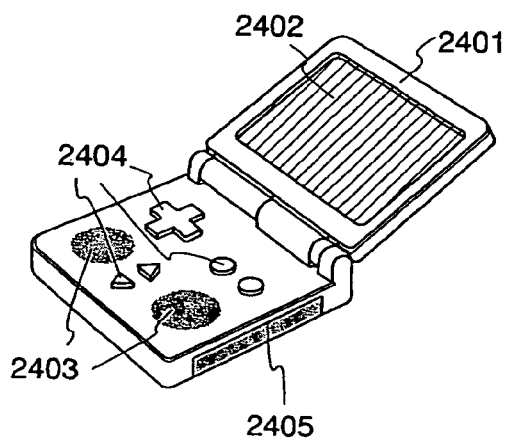
Figure 14A:
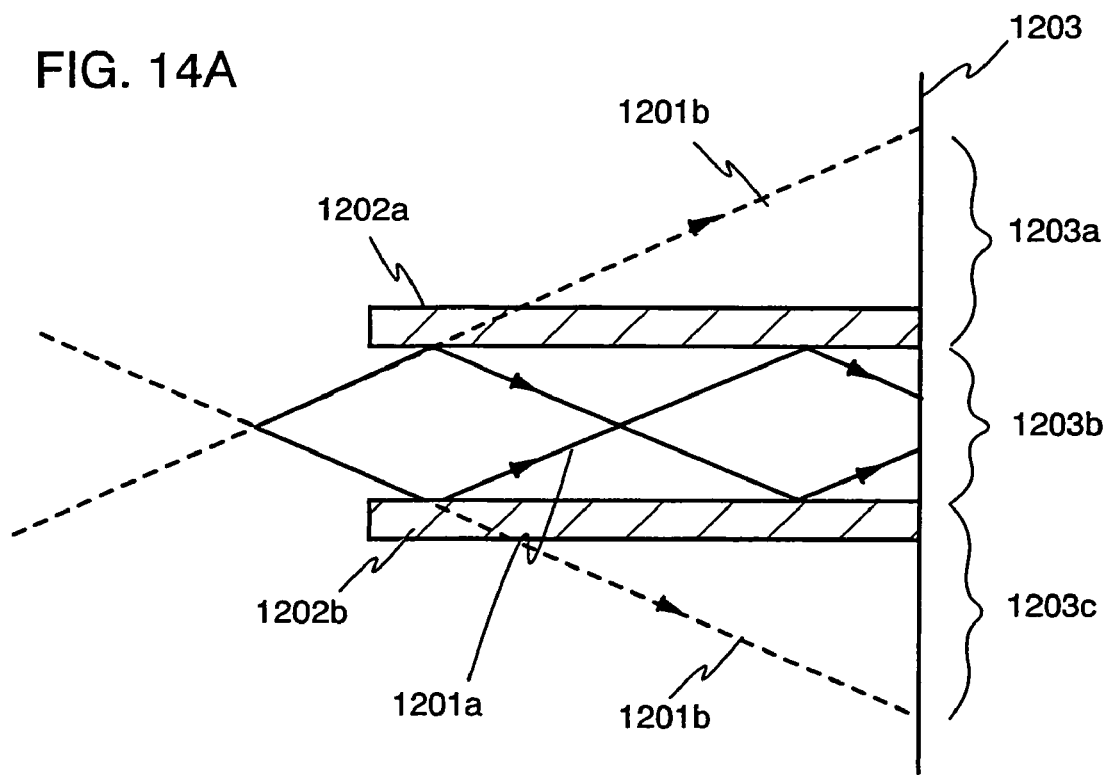
FIGS. 14A and 14B describe homogenization of energy distribution by an optical waveguide.
Figure 14B:
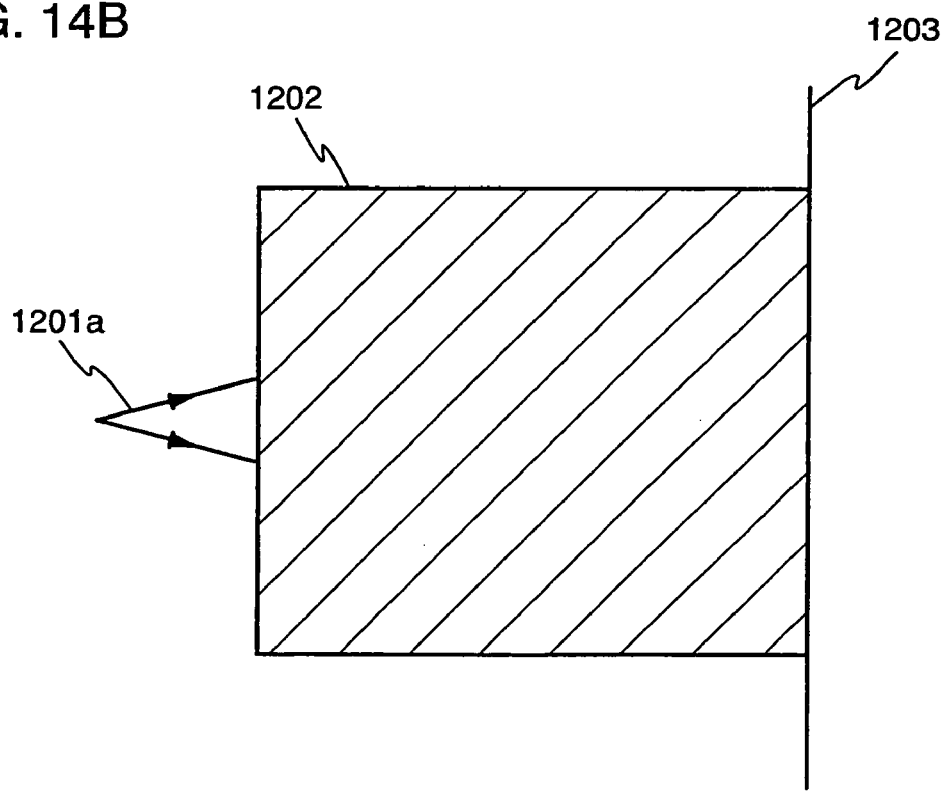

FIG. 13E shows a mobile game machine including a case 2401, a display portion 2402, speaker portions 2403, operation keys 2404, a recording medium inserting portion 2405, and the like. In the mobile game machine according to the present invention, the operating characteristic of a TFT in the display portion 2402 can be enhanced.

As thus described, the present invention can be applied in a wide range and employed in electronic appliances of every field. Moreover, the electronic appliances of this embodiment can be freely combined with any one of Embodiments 1 to 5.

What is claimed is:

1. A laser irradiation apparatus comprising:
   a laser oscillator; and
   a beam homogenizer including an optical waveguide and a deflector,
   wherein the optical waveguide is provided parallel to an optical axis of a laser beam;
   wherein the deflector is provided in contact with an entrance of the optical waveguide,
   wherein the deflector has a pair of reflection planes tilted to the optical axis of the laser beam.

2. A laser irradiation apparatus according to claim 1, wherein a tilt angle θ of each of the reflection planes satisfies α<θ<(90° +α)/2, where the α is a convergence angle of the laser beam.

3. A laser irradiation apparatus according to claim 1, wherein the optical waveguide has a pair of reflection planes opposing to each other.

4. A laser irradiation apparatus according to claim 1, wherein the deflector has an angle adjusting mechanism for adjusting the tilt angle of each of the reflection planes.

5. A laser irradiation apparatus according to claim 4, wherein the angle adjusting mechanism is at least one of a goniometer and a manipulator.

6. A laser irradiation apparatus according to claim 1, wherein the laser oscillator is at least one selected from the group consisting of an excimer laser, a YAG laser, a glass laser, a YVO$_4$ laser, a YLF laser, and an Ar laser.

7. A laser irradiation apparatus according to claim 1, wherein a beam spot delivered from the beam homogenizer to an irradiation surface has an aspect ratio of 100 or more.

8. A laser irradiation apparatus comprising:
   a laser oscillator;
   a beam homogenizer including an optical waveguide and a deflector; and
   a beam profiler,
   wherein the optical waveguide is provided parallel to an optical axis of a laser beam;
   wherein the deflector is provided in contact with an entrance of the optical waveguide,
   wherein the deflector has a pair of reflection planes tilted to the optical axis of the laser beam, and
   wherein the beam profiler is provided at an exit of the optical waveguide.

9. A laser irradiation apparatus according to claim 8, wherein a tilt angle θ of each of the reflection planes satisfies α<θ<(90° +α)/2, where the α is a convergence angle of the laser beam.

10. A laser irradiation apparatus according to claim 8, wherein the optical waveguide has a pair of reflection planes opposing to each other.

11. A laser irradiation apparatus according to claim 8, wherein the deflector has an angle adjusting mechanism for adjusting the tilt angle of each of the reflection planes.

12. A laser irradiation apparatus according to claim 11, wherein the angle adjusting mechanism is at least one of a goniometer and a manipulator.

13. A laser irradiation apparatus according to claim 8, wherein the laser oscillator is at least one selected from the group consisting of an excimer laser, a YAG laser, a glass laser, a $YVO_4$ laser, a YLF laser, and an Ar laser.

14. A laser irradiation apparatus according to claim 8, wherein a beam spot delivered from the beam homogenizer to an irradiation surface has an aspect ratio of 100 or more.

15. A laser irradiation apparatus comprising:
a laser oscillator;
a beam homogenizer including an optical waveguide and a deflector; and
a mount covering the beam homogenizer,
wherein the optical waveguide is provided parallel to an optical axis of a laser beam,
wherein the deflector is provided in contact with an entrance of the optical waveguide,
wherein the deflector has a pair of reflection planes tilted to the optical axis of the laser beam, and
wherein the mount has a tube connected thereto.

16. A laser irradiation apparatus according to claim 15, wherein a tilt angle θ of each of the reflection planes satisfies $\alpha < \theta < (90° + a)/2$, where the $\alpha$ is a convergence angle of the laser beam.

17. A laser irradiation apparatus according to claim 15, wherein the optical waveguide has a pair of reflection planes opposing to each other.

18. A laser irradiation apparatus according to claim 15, wherein the deflector has an angle adjusting mechanism for adjusting the tilt angle of each of the reflection planes.

19. A laser irradiation apparatus according to claim 18, wherein the angle adjusting mechanism is at least one of a goniometer and a manipulator.

20. A laser irradiation apparatus according to claim 15, wherein the laser oscillator is at least one selected from the group consisting of an excimer laser, a YAG laser, a glass laser, a $YVO_4$ laser, a YLF laser, and an Ar laser.

21. A laser irradiation apparatus according to claim 15, wherein a beam spot delivered from the beam homogenizer to an irradiation surface has an aspect ratio of 100 or more.

22. A laser irradiation apparatus according to claim 15, wherein inert gas flows into the optical waveguide through the tube connected to the mount.

* * * * *